US012733361B2

(12) United States Patent
Guo et al.

(10) Patent No.: US 12,733,361 B2
(45) Date of Patent: Sep. 8, 2026

(54) SUBSTRATE AND MANUFACTURING METHOD THEREOF, AND DISPLAY PANEL

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yuanzheng Guo, Beijing (CN); Xiaoqi Ding, Beijing (CN); Tao Gao, Beijing (CN); Liqiang Chen, Beijing (CN); Li Jia, Beijing (CN); Dianjie Hou, Beijing (CN)

(73) Assignees: CHENGDU BOE OPTOELECTRONICS TECHNOLOGY CO., LTD., Chengdu (CN); BOE TECHNOLOGY GROUP CO., LTD, Beijing (CN)

( * ) Notice: Subject to any disclaimer, the term of this patent is extended or adjusted under 35 U.S.C. 154(b) by 482 days.

(21) Appl. No.: 18/557,714

(22) PCT Filed: Jun. 29, 2022

(86) PCT No.: PCT/CN2022/102506
§ 371 (c)(1),
(2) Date: Oct. 27, 2023

(87) PCT Pub. No.: WO2024/000314
PCT Pub. Date: Jan. 4, 2024

(65) Prior Publication Data

US 2025/0089491 A1 Mar. 13, 2025

(51) Int. Cl.
*H10K 77/10* (2023.01)
*H10K 59/12* (2023.01)
(Continued)

(52) U.S. Cl.
CPC ....... *H10K 59/131* (2023.02); *H10K 59/1201* (2023.02); *H10K 59/8792* (2023.02); *H10K 77/111* (2023.02)

(58) Field of Classification Search
CPC ............. H10K 59/131; H10K 59/1201; H10K 59/8792; H10K 77/111; H10K 59/00;
(Continued)

(56) References Cited

U.S. PATENT DOCUMENTS

| | | | |
|---|---|---|---|
| 2016/0358947 A1 | 12/2016 | Cai et al. |
| 2022/0115474 A1 | 4/2022 | Jia et al. |

(Continued)

FOREIGN PATENT DOCUMENTS

| | | |
|---|---|---|
| CN | 108874256 A | 11/2018 |
| CN | 113035912 A | 6/2021 |

(Continued)

OTHER PUBLICATIONS

PCT International Search Report (w/ English translation) and Written Opinion for corresponding PCT Application No. PCT/CN2022/102506, dated Jan. 18, 2023, 9 pages.

*Primary Examiner* — Elias Ullah
(74) *Attorney, Agent, or Firm* — Dority & Manning, P.A.

(57) ABSTRACT

A substrate includes a first base, a first trace, a first organic layer, a first inorganic layer, and a second trace. The first organic layer includes at least one first via hole, and a first via hole exposes a portion of the first trace. The first inorganic layer includes at least one second via hole. On the first base, an orthographic projection of an edge of an opening of a second via hole proximate to the first via hole is substantially coincident with an orthographic projection of an edge of an opening of the first via hole proximate to the second via hole. The first and second via holes are communicated to form a connecting hole to connect the first and
(Continued)

second traces. A ratio of a depth of the connecting hole to a maximum radial dimension of the connecting hole ranges from 1:1 to 1:2, inclusive.

20 Claims, 22 Drawing Sheets

(51) Int. Cl.
*H10K 59/131* (2023.01)
*H10K 59/80* (2023.01)

(58) Field of Classification Search
CPC .... H10K 59/126; H10K 59/124; H10D 84/01; H10D 86/00
See application file for complete search history.

(56) References Cited

U.S. PATENT DOCUMENTS

| | | | |
|---|---|---|---|
| 2022/0140280 | A1 | 5/2022 | Yang |
| 2022/0399524 | A1 | 12/2022 | Jia et al. |
| 2022/0406875 | A1 | 12/2022 | Zhang et al. |

FOREIGN PATENT DOCUMENTS

| | | | |
|---|---|---|---|
| CN | 113644104 | A | 11/2021 |
| CN | 214586834 | U | 11/2021 |
| CN | 114171567 | A | 3/2022 |

SUBSTRATE AND MANUFACTURING METHOD THEREOF, AND DISPLAY PANEL

CROSS-REFERENCE TO RELATED APPLICATION

This application is a national phase entry under 35 USC 371 of International Patent Application No. PCT/CN2022/102506 filed on Jun. 29, 2022, which is incorporated herein by reference in its entirety.

TECHNICAL FIELD

The present disclosure relates to the field of display technologies, and in particular, to a substrate and a manufacturing method thereof, and a display panel.

BACKGROUND

The organic light-emitting diode (OLED) display device has a series of advantages of self-luminescence, fast response speed, high brightness, full viewing angle, applicable to flexible display, and the like, and thus becomes one of display devices with great competitiveness and development prospect.

In a display device, a display area and a peripheral area located around the display area are provided. Various types of signal lines, such as gate lines, data lines, and the like are generally provided in the display area. Fan-out traces for connecting each signal line and a corresponding driving chip are generally provided in the peripheral area.

SUMMARY

In an aspect, a substrate is provided, which includes a first base, a first trace, a first organic layer, a first inorganic layer, and a second trace. The first trace is located on a side of the first base. The first organic layer is located on a side of the first trace away from the first base, where the first organic layer includes at least one first via hole, and a first via hole exposes a portion of the first trace. The first inorganic layer is located on a side of the first organic layer away from the first base, where the first inorganic layer includes at least one second via hole; an orthographic projection, on the first base, of an edge of an opening of a second via hole at a side proximate to the first via hole is substantially coincident with an orthographic projection, on the first base, of an edge of an opening of the first via hole at a side proximate to the second via hole; the second via hole is communicated with the first via hole to form a connecting hole; a ratio of a depth of the connecting hole to a maximum radial dimension of the connecting hole is in a range of 1:1 to 1:2, inclusive. The second trace is located on a side of the first inorganic layer away from the first base, where the second trace is connected to the first trace through the connecting hole.

In some embodiments, the substrate includes a plurality of connecting holes, where a minimum distance between two adjacent connecting holes is greater than or equal to 3 μm.

In some embodiments, a slope angle of the first via hole is in a range of 70 degrees to 90 degrees, inclusive, and/or a slope angle of the second via hole is in a range of 70 degrees to 90 degrees, inclusive.

In some embodiments, along a direction from the first organic layer toward the first base, opening areas of the connecting hole decrease.

In some embodiments, the first organic layer serves as a second base; the substrate further includes a plurality of conductive layers, where the plurality of conductive layers are arranged on the side of the first organic layer away from the first base in a stack; and the second trace is located in any one of the conductive layers.

In some embodiments, the plurality of conductive layers include an active layer; the substrate further includes a light-shielding pattern, arranged in a same layer as the first trace, where an orthographic projection of a channel portion of the active layer on the first base is located within an orthographic projection of the light-shielding pattern on the first base.

In some embodiments, the plurality of conductive layers include a first gate metal layer and a second gate metal layer, where the second trace is located in the second gate metal layer; and the first inorganic layer includes at least one of: a first gate insulating layer, a second gate insulating layer or an interlayer dielectric layer, where the first gate insulating layer is located between the first organic layer and the first gate insulating layer; the second gate insulating layer is located between the first gate metal layer and the second gate metal layer; and the interlayer dielectric layer is located on a side of the second gate metal layer away from the first base.

In some embodiments, the substrate has: a display area, a first fan-out area and a bending area, where the first fan-out area is located between the display area and the bending area, where the second trace is located in the display area and extends to the first fan-out area; the first trace is located in the bending area, and an end of the first trace extends to the first fan-out area; and at least one connecting hole is a first-type connecting hole, and the first-type connecting hole is located in the first fan-out area; and the end of the first trace located in the first fan-out area is electrically connected to a portion of the second trace located in the first fan-out area through the first-type connecting hole.

In some embodiments, the substrate has: a display area and a bending area, where the second trace is located in the display area; the first trace is located in the bending area, and an end of the first trace extends to the display area; and at least one connecting hole is a second-type connecting hole, and the second-type connecting hole is located in the display area; and the end of the first trace located in the display area is electrically connected to the second trace through the second-type connecting hole.

In some embodiments, the display area includes a first display region, a second display region, and a third display region, where the second display region is located between the first display region and the third display region, and the third display region is closer to the bending area than the second display region; and the second-type connecting hole is located in any one of the first display region, the second display region and the third display region.

In some embodiments, the substrate has: a display area, a bending area and a second fan-out area, where the bending area is located between the display area and the second fan-out area; and the substrate further includes a third trace, where the third trace is located in the second fan-out area, where the first trace is located in the bending area, and an end of the first trace extends to the second fan-out area; and at least one connecting hole is a third-type connecting hole, and the third-type connecting hole is located in the second fan-out area; the end of the first trace located in the second fan-out area is electrically connected to the third trace through the third-type connecting hole.

In another aspect, a manufacturing method of a substrate is provided. The manufacturing method includes: forming a first trace on a first base; forming a first organic layer on a side of the first trace away from the first base; forming a first inorganic layer on a side of the first organic layer away from the first base; forming a first mask pattern on a side of the first inorganic layer away from the first base, where the first mask pattern includes a first opening; etching the first inorganic layer by a first etching process by using the first opening to form a first transition hole in the first inorganic layer, where the first transition hole exposes a portion of the first organic layer; and a rate at which the first etching process etches the first inorganic layer is greater than a rate at which the first etching process etches the first organic layer; etching the first organic layer by a second etching process by using the first opening to form a second transition hole in the exposed portion of the first organic layer, where a depth of the second transition hole is less than or equal to a thickness of the first organic layer; and a rate at which the second etching process etches the first organic layer is greater than a rate at which the second etching process etches the first inorganic layer; removing the first mask pattern; forming a second mask pattern on a side of the first inorganic layer away from the first base, where the second mask pattern includes a second opening opposite to the first opening; and an area of the second opening is greater than an area of the first opening; etching the first inorganic layer and the first organic layer by the first etching process by using the second opening, so that the first transition hole is expanded outwardly to form a second via hole, and the second transition hole is expanded outwardly to form a first via hole, where an orthographic projection, on the first base, of an edge of an opening of the second via hole at a side proximate to the first via hole is substantially coincident with an orthographic projection, on the first base, of an edge of an opening of the first via hole at a side proximate to the second via hole; and the first via hole and the second via hole form a connecting hole, and the connecting hole exposes a portion of the first trace; removing the second mask pattern; and forming a second trace on a side of the first inorganic layer away from the first base, where the second trace is connected to the first trace through the connecting hole.

In some embodiments, a result of H1 minus H2 is less than or equal to H3 ($H1-H2 \leq H3$), where H1 is the thickness of the first organic layer, H2 is the depth of the second transition hole, and H3 is a thickness of the first inorganic layer.

In some embodiments, a distance between an edge of an orthographic projection of the first opening on the first base and an orthographic projection of an edge of the second opening on the first base is in a range of 0.5 μm to 1 μm, inclusive.

In some embodiments, forming the first mask pattern includes: forming a first organic light-sensitive material layer on the side of the first inorganic layer away from the first base; and exposing and developing the first organic light-sensitive material layer by using a first mask plate to form the first mask pattern with the first opening; forming the second mask pattern includes: forming a second organic light-sensitive material layer on the side of the first inorganic layer away from the first base; and exposing and developing the second organic light-sensitive material layer by using the first mask plate to form the second mask pattern with the second opening. A thickness of the first organic light-sensitive material layer is greater than a thickness of the second organic light-sensitive material layer, and/or an exposure amount to the first organic light-sensitive material layer is less than an exposure amount to the second organic light-sensitive material layer.

In some embodiments, the thickness of the first organic light-sensitive material layer is approximately 3 μm, and the thickness of the second organic light-sensitive material layer is approximately 2 μm.

In some embodiments, the exposure amount to the first organic light-sensitive material layer is 50 millijoules (MJ), and the exposure amount to the second organic light-sensitive material layer is 60 millijoules (MJ).

In some embodiments, forming the first mask pattern includes: forming a first organic light-sensitive material layer on the side of the first inorganic layer away from the first base; and exposing and developing the first organic light-sensitive material layer by using a second mask plate to form the first mask pattern with the first opening; and forming the second mask pattern includes: forming a second organic light-sensitive material layer on the side of the first inorganic layer away from the first base; and exposing and developing the second organic light-sensitive material layer by using a third mask plate to form the second mask pattern with the second opening. An area of a light-transmitting region of the second mask plate is less than an area of a light-transmitting region of the third mask plate.

In some embodiments, etching the first organic layer by the second etching process by using the first opening includes: etching the first organic layer by taking the first mask pattern and the first inorganic layer as masks.

In some embodiments, etching the first inorganic layer by the first etching process by using the first opening includes: introducing a first gas into the first opening to etch the first inorganic layer; etching the first inorganic layer and the first organic layer by the first etching process by using the second opening includes: introducing the first gas into the second opening to etch the first inorganic layer and the first organic layer, where an etching rate of the first gas on the first inorganic layer is greater than an etching rate of the first gas on the first organic layer; and etching the first organic layer by the second etching process by using the first opening includes: introducing a second gas into the first opening to etch the first organic layer, where an etching rate of the second gas on the first organic layer is greater than an etching rate of the second gas on the first inorganic layer.

In some embodiments, the first gas includes carbon tetrafluoride and sulfur hexafluoride, and the second gas includes carbon tetrafluoride and oxygen.

In yet another aspect, a display panel is provided, which includes the substrate according to any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and actual timings of signals to which the embodiments of the present disclosure relate.

DETAILED DESCRIPTION

Figure 1:
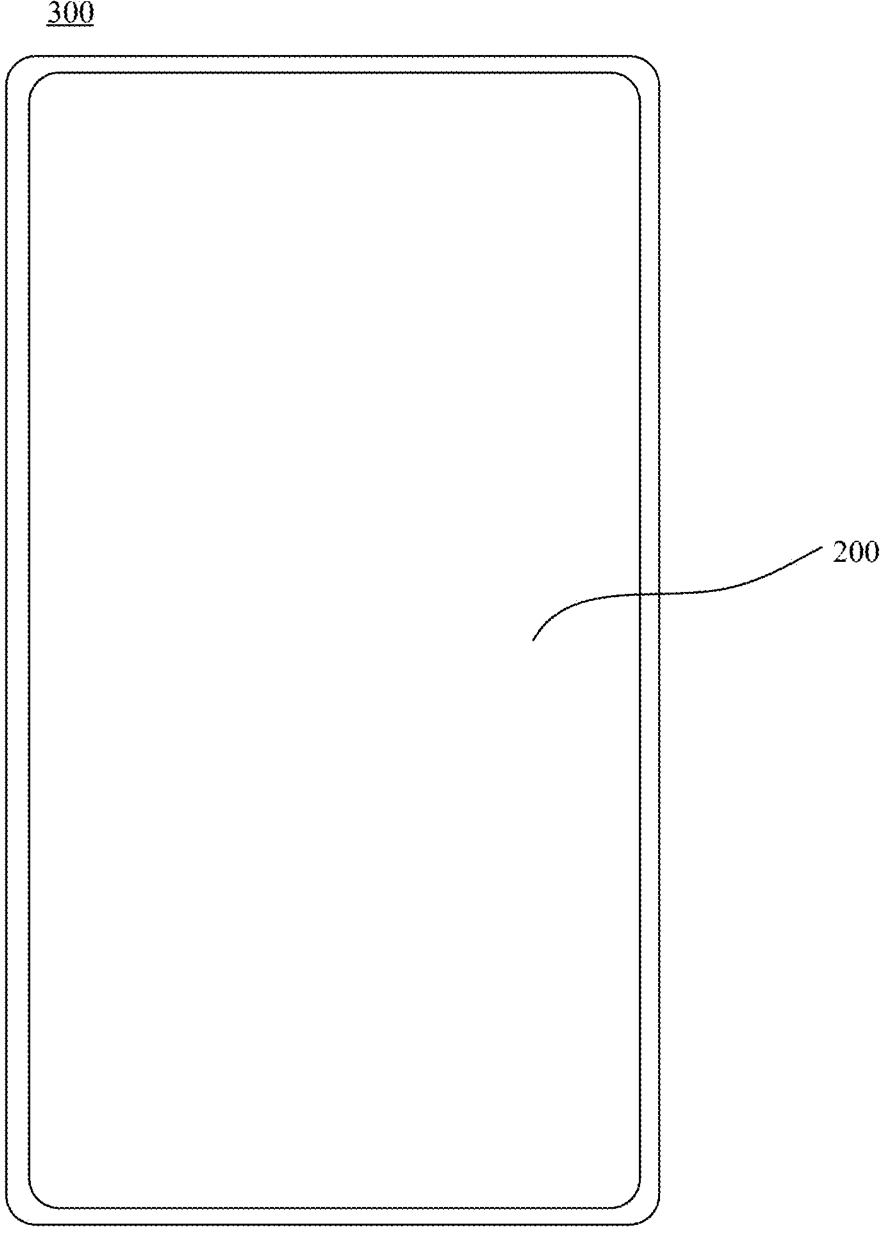
FIG. 1 is a structural diagram of a display device provided in some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, the term "comprise" and other forms thereof such as the third-person singular form "comprises" and the present participle form "comprising" throughout the specification and the claims are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representation of the above terms does not necessarily refer to the same embodiment(s) or example(s). In addition, the specific features, structures, materials or characteristics may be included in any one or more embodiments or examples in any suitable manner.

The terms "first" and "second" are used for descriptive purposes only, and are not to be construed as indicating or implying a relative importance or implicitly indicating a number of indicated technical features. Thus, features defined with "first" or "second" may explicitly or implicitly include one or more of the features. In the description of the embodiments of the present disclosure, the term "a plurality of/the plurality of/multiple" means two or more unless otherwise specified.

In the description of some embodiments, the terms "connected" and derivatives thereof may be used. For example, the term "connected" may be used in the description of some embodiments to indicate that two or more components are in direct physical or electrical contact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining" or "in response to detecting", depending on the context. Similarly, depending on the context, the phrase "if it is determined . . . " or "if [a stated condition or event] is detected" is optionally construed as "in a case where it is determined . . . ", "in response to determining . . . ", "in a case where [the stated condition or event] is detected" or "in response to detecting [the stated condition or event]".

In addition, the use of the phrase "based on" is meant to be open and inclusive, since a process, step, calculation or other action that is "based on" one or more of the stated conditions or values may, in practice, be based on additional conditions or values beyond those stated.

As used herein, the term "substantially" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

As used herein, the term "equal" includes the stated conditions and the conditions similar to the stated conditions, and the range of the similar conditions is within the acceptable deviation range, where the acceptable deviation range is determined by a person of ordinary skill in the art in consideration of the measurement in question and the error associated with the measurement of a specific quantity (i.e., the limitation of the measurement system). For example, the term "equal" includes absolute equality and approximate equality, and an acceptable range of deviation of the approximate equality may be, for example, a difference between two equals of less than or equal to any one of 30%, 20%, 10% or 5% of either of the two equals.

The "same layer" mentioned herein refers to a layer structure that is formed by forming a film layer for forming specific patterns by using a same film forming process, and then performing a single patterning process by using a same mask. Depending on different specific patterns, the single patterning process may include multiple exposure, development or etching processes, and the specific patterns in the formed layer structure may be continuous or discontinuous, and these specific patterns may also be at different heights or have different thicknesses.

It will be understood that, in a case where a layer or component is referred to as being on another layer or a substrate, it may be that the layer or component is directly on the another layer or substrate; or it may be that intermediate layer(s) exist between the layer or component and the another layer or substrate.

Exemplary embodiments are described herein with reference to sectional views and/or plan views as idealized exemplary drawings. In the accompanying drawings, thicknesses of layers and sizes of regions are enlarged for clarity. Therefore, variations in shapes with respect to the accompanying drawings due to, for example, manufacturing technologies and/or tolerances may be envisaged. Therefore, the exemplary embodiments should not be construed as being limited to the shapes of the regions shown herein, but including deviations due to, for example, ideally, an outline of an orthographic projection of a film pattern on a certain plane has a rectangular shape. For example, manufacturing. Therefore, the regions shown in the accompanying drawings are schematic in nature, and their shapes are not intended to show actual shapes of regions in a device, and are not intended to limit the scope of the exemplary embodiments.

FIG. 1 is a structural diagram of a display device provided in some embodiments of the present disclosure. Referring to FIG. 1, some embodiments of the present disclosure provide a display device 300, and the display device 300 includes a display panel 200.

For example, the display device 300 further includes a frame, a display driver integrated circuit (IC), other electronic components, and the like.

For example, the display device 300 may be an electroluminescence display device or a photoluminescence display device. In a case where the display device 300 is an electroluminescent display device, the electroluminescent display device may be an organic electroluminescent display device (organic light-emitting diode display device, OLED display device) or a quantum dot electroluminescent display device (quantum dot light-emitting diode display device, QLED display device). In a case where the display device 300 is a photoluminescence display device, the photoluminescence display device may be a quantum photoluminescence display device (quantum dot light-emitting display device, QLED display device).

For example, the display device 300 may be any apparatus that can display images whether in motion (e.g., videos) or stationary (e.g., static images), and whether literal or graphical. More specifically, it is expected that the embodiments may be implemented in or associated with a plurality of electronic devices. The plurality of electronic devices may include (but is not limit to), for example, mobile telephones, wireless devices, personal data assistants (PDA), hand-held or portable computers, GPS receivers/navigators, cameras, MP4 video players, video cameras, game consoles, watches, clocks, calculators, TV monitors, flat panel displays, computer monitors, car displays (such as odometer displays), navigators, cockpit controllers and/or displays, camera view displays (such as rear view camera displays in vehicles), electronic photos, electronic billboards or indicators, projectors, building structures, packagings and aesthetic structures (such as a display for an image of a piece of jewelry), and the like.

Figure 2:
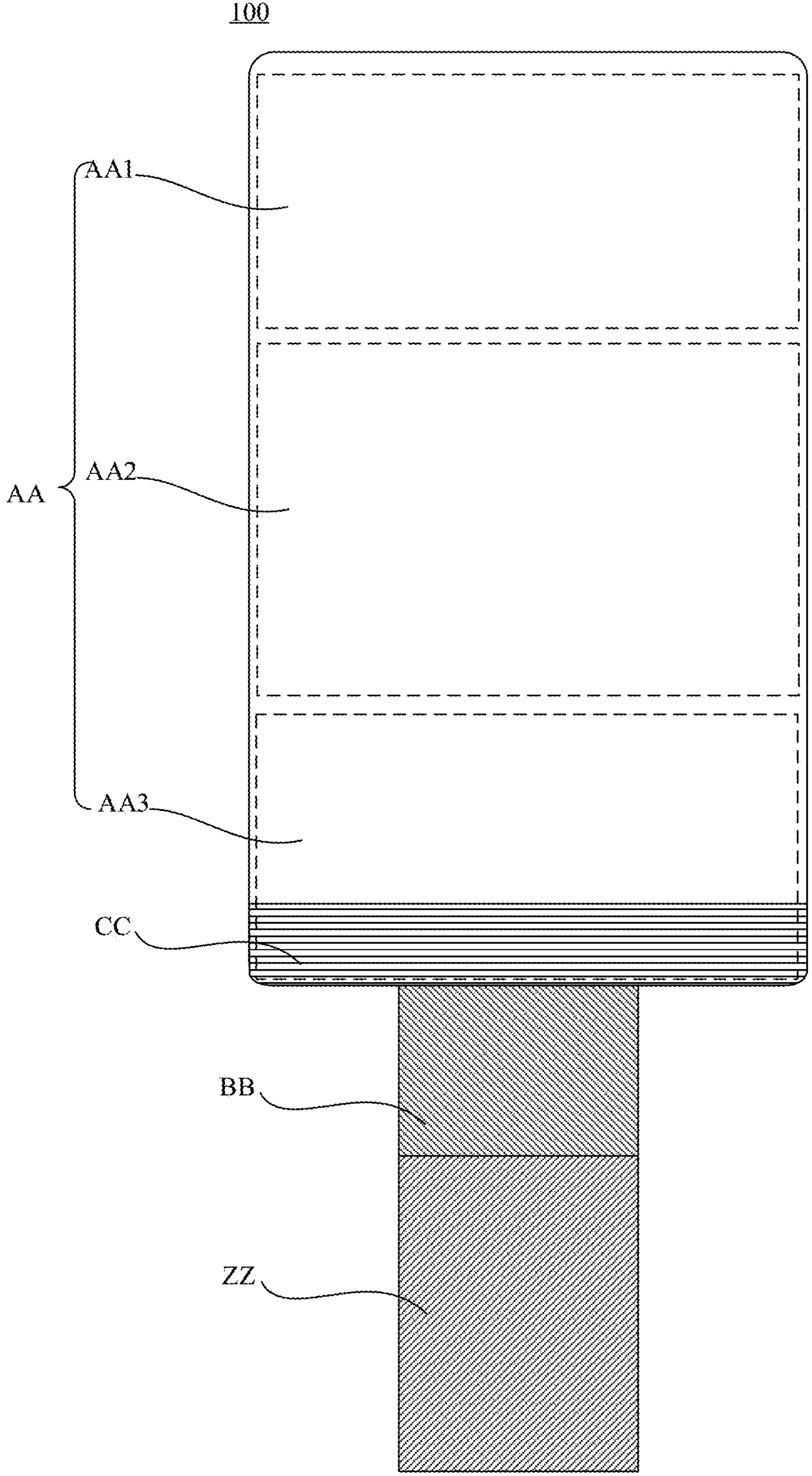
FIG. 2 is a structural diagram of a substrate provided in some embodiments of the present disclosure.

FIG. 2 is a structural diagram of a substrate in some embodiments of the present disclosure. In some embodiments, referring to FIG. 2, the above-mentioned display panel 200 includes a substrate 100.

In some examples, the substrate 100 is a display substrate having a display function, such as an OLED (organic light-emitting diode, OLED) display substrate, a QLED (quantum dot light-emitting diode, QLED) display substrate, a Mini LED (Mini light-emitting diode) display substrate, or a Micro LED (Micro light-emitting diode) display substrate. In other examples, the substrate 100 is a light-emitting substrate having a light-emitting function, such as a Mini LED light-emitting substrate. In yet some other examples, the substrate 100 is a circuit substrate, a driving substrate, or the like. Here, the circuit substrate is distinguished from the driving substrate by that: the circuit substrate includes a base and traces located on the base, while the driving substrate may further include driving circuits such as pixel circuits, register circuits, or the like.

Figure 3:
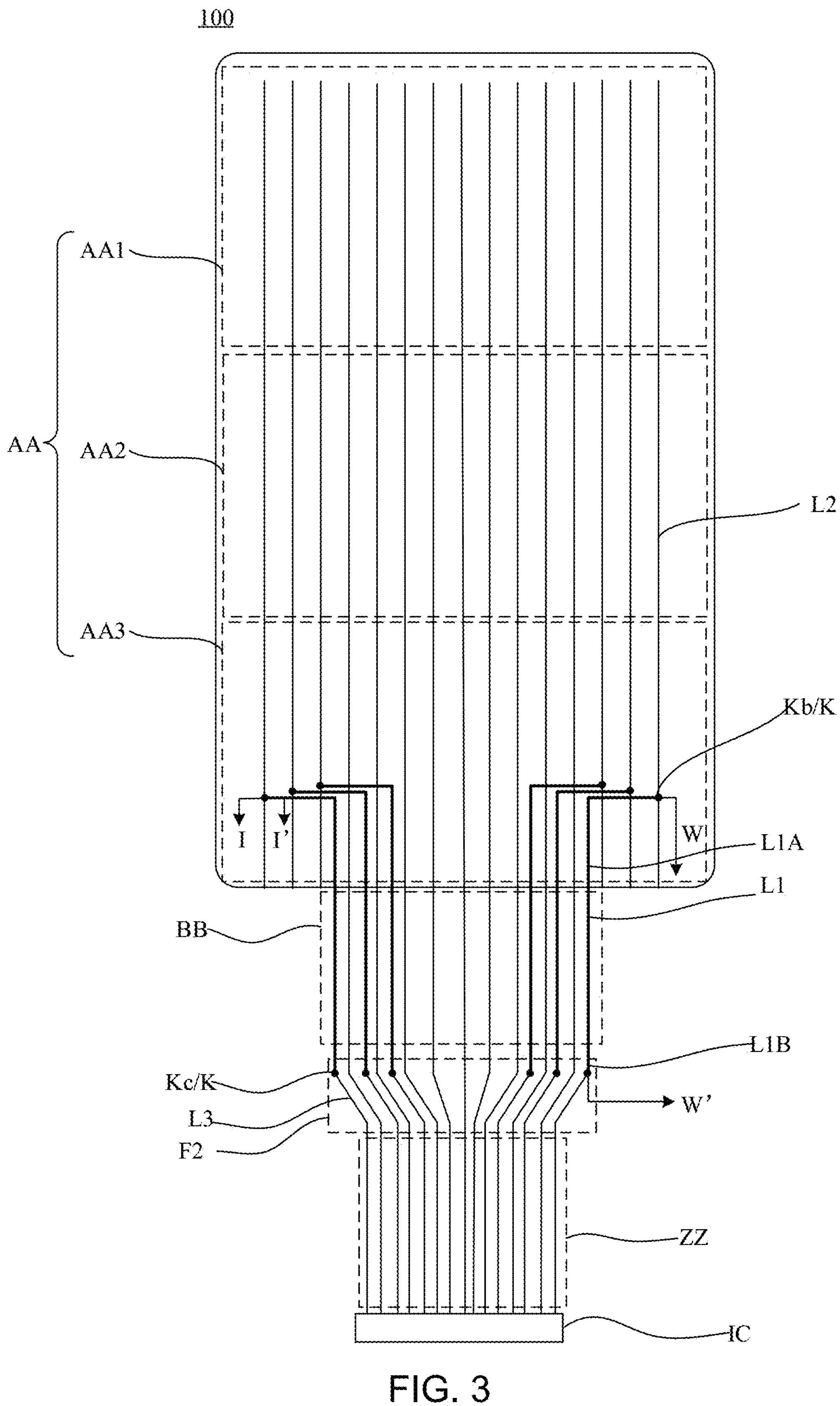
FIG. 3 is a structural diagram of the substrate in FIG. 2.
Figure 4:
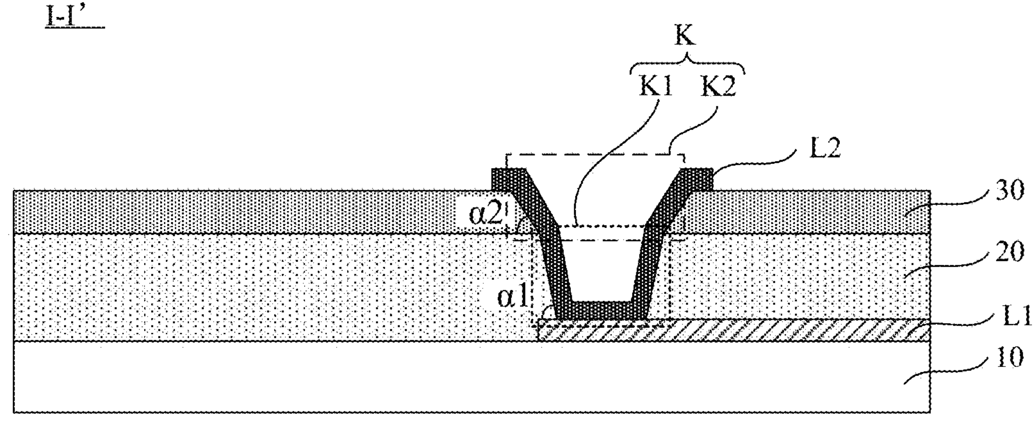
FIG. 4 is a sectional view taken along the line I-I' in FIG. 3.
Figure 5:
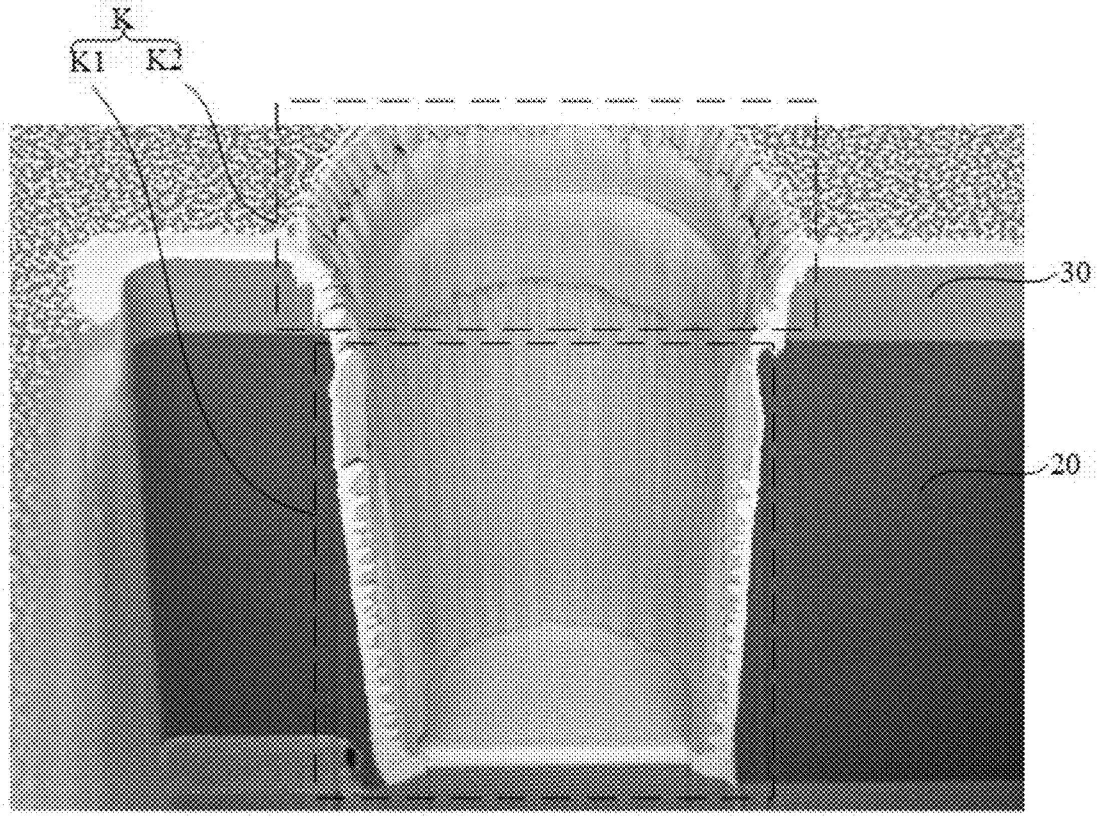
FIG. 5 is an electron micrograph of a substrate at a connecting hole thereof provided in some embodiments of the present disclosure.

FIG. 3 is a schematic diagram showing a specific structure of the substrate in FIG. 2. FIG. 4 is a sectional view taken along the line I-I' in FIG. 3. FIG. 5 is an electron micrograph of a substrate at a connecting hole thereof provided in some embodiments of the present disclosure. FIG. 3 shows an arrangement manner of connecting holes K, first traces L1 and second traces L2 in detail. The region CC in FIG. 2 is provided therein with connecting holes K. Referring to FIG. 2 to FIG. 5, some embodiments of the present disclosure provide a substrate 100, which included: a first base 10, first trace(s) L1, a first organic layer 20, a first inorganic layer 30, and second trace(s) L2.

In some examples, the first base 10 may be a flexible base. For example, a material of the first base 10 may be an organic material. For example, the material of the first base 10 may be any one of polyimide (PI), polycarbonate (PC) or polyvinyl chloride (PVC).

In some examples, a thickness of the first base 10 may be in a range of 5 μm to 20 μm, inclusive. That is, the thickness of the first base 10 is set in the range of 5 μm to 20 μm, inclusive. In a case where the thickness of the first base 10 is equal to or approaches 5 μm, the first base 10 having a small thickness may facilitate the substrate 100 to have a light weight and small thickness. In a case where the thickness of the first base 10 is equal to or approaches 20 μm, the first base 10 having a large thickness may provide a good support effect for supporting other film layers arranged on the first base 10 in a stack.

In some examples, the thickness of the first base 10 may be in a range of 10 μm to 20 μm, inclusive. That is, the thickness of the first base 10 is set in the range of 10 μm to 20 μm, inclusive, so that the first base 10 having a large thickness may provide a good support effect.

In some examples, the thickness of the first base 10 may be in a range of 10 μm to 15 μm, inclusive. That is, the thickness of the first base 10 is set in the range of 10 μm to 15 μm, inclusive, so that the first substrate 10 may avoid an excessive thickness while provide a good support effect, thereby facilitating the substrate 100 to have a light weight and small thickness.

For example, the thickness of the first base 10 may be any one of 10 μm, 15 μm, and 20 μm.

The first trace L1 is located on a side of the first base 10.

The first organic layer 20 is located on a side of the first trace L1 away from the first base 10. The first organic layer 20 includes at least one first via hole K1, and a first via hole K1 exposes a portion of the first trace L1.

For example, the first organic layer 20 may be second base. In this case, the first organic layer 20 may be a flexible base. For example, a material of the first organic layer 20 may be any one of polyimide (PI), polycarbonate (PC) or polyvinyl chloride (PVC). Materials of the first organic layer 20 and the first base 10 may be same. It can be understood that in some other embodiments, the material of the first organic layer 20 may be different from the material of the first base 10.

In some examples, a thickness of the first organic layer 20 may be in a range of 1 μm to 10 μm, inclusive. That is, the thickness of the first organic layer 20 is set in the range of 1 μm to 10 μm, inclusive. In a case where the thickness of the first organic layer 20 is equal to or approaches 1 μm, the first organic layer 20 having a small thickness may facilitate the substrate 100 to have a light weight and a small thickness, and facilitate forming the first via hole K1 in the first organic layer 20 to extend through the first organic layer 20, which helps reduce the process difficulty of the substrate 100. In a case where the thickness of the first organic layer 20 is equal to or approaches 10 μm, the first organic layer 20 having a large thickness as the second base may provide a good support effect for supporting film layers arranged on a side of the first organic layer 20 away from the first base 10 in a stack.

In some examples, the thickness of the first organic layer 20 may be in a range of 4 μm to 10 μm, inclusive. That is, the thickness of the first organic layer 20 is set in the range of 4 μm to 10 μm, inclusive. The first organic layer 20 having a large thickness as the second base may provide a good support effect for supporting film layers arranged on a side of the first organic layer 20 away from the first base 10.

In some examples, the thickness of the first organic layer 20 may be in a range of 4 μm to 8 μm, inclusive. That is, the thickness of the first organic layer 20 is set in the range of 4 μm to 8 μm, inclusive. The thickness of first organic layer 20 can meet the requirements of the role of the first organic layer 20 in providing support and facilitate forming the first via hole K1 in the first organic layer 20 to extend through the first organic layer 20, which helps reduce the process difficulty of the substrate 100.

For example, the thickness of the first organic layer 20 may be any one of 5 μm, 6 μm, and 7 μm.

In some examples, the thickness of the first organic layer 20 may be less than or equal to the thickness of the first base 10. Since the first base 10 does not need to be provided with a via hole or the like, the thickness of the first base 10 may be set to be relatively large, so as to ensure the supporting function of the first base 10 in the substrate 100. The thickness of the first organic layer 20 located above the first base 10 may be set to be relatively small, which facilitates the via design and can also play a supporting role to a certain extent. For example, the thickness of the first organic layer 20 may be equal to or less than half the thickness of the first base 10. For example, the thickness of the first organic layer 20 is 5 μm, and the thickness of the first base 10 is 15 μm.

The first inorganic layer 30 is located on a side of the first organic layer 20 away from the first base 10. The first inorganic layer 30 includes at least one second via hole K2. A second via hole K2 communicates with a first via hole K1 to form a connecting hole K.

Figure 6:
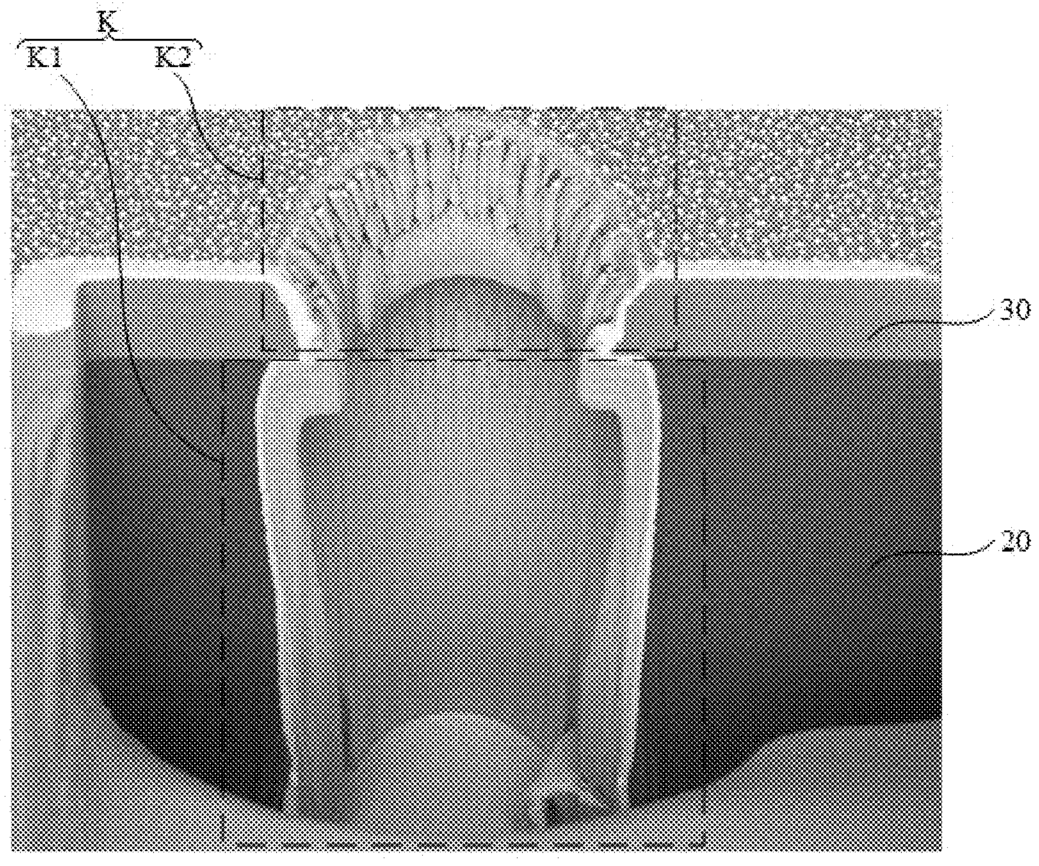
FIG. 6 is an electron micrograph of a substrate at a connecting hole thereof in some implementations.
Figure 7:
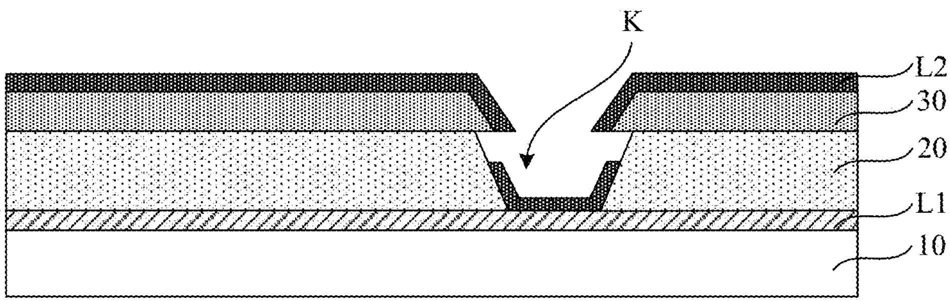
FIG. 7 is a sectional view of a local structure of a substrate in some implementations.

FIG. 6 is an electron micrograph of a substrate at a connecting hole thereof in some implementations. FIG. 7 is a sectional view of a local structure of a substrate in some implementations. In some of the above-described implementations, referring to FIG. 6 and FIG. 7, when a first via hole K1 is formed in the first organic layer 20 and a second via hole K2 is formed in the first inorganic layer 30, due to different materials of the first organic layer 20 and the first inorganic layer 30, a lateral etching may occur to different extents when the first organic layer 20 and the first inorganic layer 30 are etched. For example, the lateral etching problem is not obvious in the first inorganic layer 30, but the lateral etching problem is obvious in the first organic layer 20, which may cause that an orthographic projection, on the first base 10, of an edge of an opening of the first via hole K1 at a side proximate to the second via hole K2 falls into an orthographic projection, on the first base 10, of an edge of an opening of the second via hole K2 at a side proximate to the first via hole K1, thereby forming an undercut structure. If a second trace L2 is formed directly on the first inorganic layer 30, the second trace L2 may be broken at a position of the undercut structure, which may affect the quality of the substrate 100.

In addition, since the process is difficult in a case of setting a thickness of the first organic layer 20 in the prior art to be small, a depth of the first via hole K1 that is formed in the first organic layer 20 and extends therethrough is relatively large, which exacerbates the problem of a lateral etching during etching of the first organic layer 20. This results in an increased occurrence of the undercut in a connecting hole K. For example, when the second trace L2 is directly formed on the first inorganic layer 30, the severity of the breaking of the second trace L2 at the position of the undercut structure is increased, which affects the quality of the substrate 100.

In the substrate 100 of some embodiments of the present disclosure, an orthographic projection, on the first base 10, of an edge of an opening of the second via hole K2 at a side proximate to the first via hole K1 is substantially coincident with an orthographic projection, on the first base 10, of an edge of an opening of the first via hole K2 at a side proximate to the second via hole K2. The second via hole K2 is communicated with the first via hole K1 to form a connecting hole K. A ratio of a depth of the connecting hole K to a maximum radial dimension of the connecting hole K is in a range of 1:1 to 1:2, inclusive.

The second trace L2 is located on a side of the first inorganic layer 30 away from the first base 10. The second trace L2 is connected to the first trace L1 through the connecting hole K.

Referring to FIG. 4 and FIG. 5, the orthographic projection, on the first base 10, of the edge of the opening of the second via hole K2 at the side proximate to the first via hole K1 is substantially coincident with the orthographic projection, on the first base 10, of the edge of the opening of the first via hole K2 at the side proximate to the second via hole K2, so that a side wall of the first via hole K1 and a side wall of the second via hole K2 are in smooth transition at an intersection position therebetween. The problem that the second trace L2 is broken due to a fact that an undercut structure exists on the interface position of the side wall of the first via hole K1 and the side wall of the second via hole K2 is solved, thereby reducing the risk of breakage of traces in the substrate 100 and improving the yield of the substrate 100.

It will be noted that the term "substantially coincide" includes both absolute coincidence and approximate coincidence. That is, as long as a gap between the orthographic projection, on the first base 10, of the edge of the opening of the second via hole K2 at the side proximate to the first via hole K1 and the orthographic projection, on the first base 10, of the edge of the opening of the first via hole K2 at the side proximate to the second via hole K2 does not fluctuate beyond an error threshold, the edges of the two via holes are considered to be relatively "coincident". Here, the present disclosure does not limit the specific value of the error threshold, as long as when the gap is within the error threshold range, the second trace L2 will not break when passing through the connecting hole K.

In addition, the ratio of the depth of the connecting hole K to the maximum radial dimension of the connecting hole K is in the range of 1:1 to 1:2, inclusive. In a case where the ratio of the depth of the connecting hole K to the maximum radial dimension of the connecting hole K is equal to or approaches 1:1, it is possible to further reduce the maximum radial dimension of the first via hole K1, i.e., to reduce a maximum radial dimension of the connecting hole K, which facilitates a wiring layout of the substrate 100, while satisfying that the orthographic projection, on the first base 10, of the edge of the opening of the second via hole K2 at the side proximate to the first via hole K1 is substantially coincident with the orthographic projection, on the first base 10, of the edge of the opening of the first via hole K2 at the side proximate to the second via hole K2. In a case where the ratio of the depth of the connecting hole K to the maximum radial dimension of the connecting hole K is equal to or approaches 1:2, the orthographic projection, on the first base 10, of the edge of the opening of the second via hole K2 at the side proximate to the first via hole K1 is further substantially coincident with the orthographic projection, on the first base 10, of the edge of the opening of the first via hole K2 at the side proximate to the second via hole K2, which prevents the undercut from existing on the interface position of the side wall of the first via hole K1 and the side wall of the second via hole K2, and prevents the breakage of the second trace L2, while preventing the wiring layout of the substrate 100 from being affected.

In some examples, the ratio of the depth of the connecting hole K to the maximum radial dimension of the connecting hole K is in a range of 1:1 to 1:1.8, inclusive. The ratio of the depth of the connecting hole K to the maximum radial dimension of the connecting hole K is in the range of 1:1 to 1:1.8, inclusive, so that the maximum radial dimension of the connecting hole K is relatively small, which facilitates the wiring layout of the substrate 100, while solving the problem of the undercut in the connecting hole K.

In some examples, the ratio of the depth of the connecting hole K to the maximum radial dimension of the connecting hole K is in a range of 1:1.3 to 1:1.8, inclusive. The ratio of the depth of the connecting hole K to the maximum radial dimension of the connecting hole K is in the range of 1:1.3 to 1:1.8, inclusive, so that the maximum radial dimension of the connecting hole K is relatively large, which further solves the problem of the undercut in the connecting hole K, while preventing the wiring layout of the substrate 100 from being affected.

In some examples, the ratio of the depth of the connecting hole K to the maximum radial dimension of the connecting hole K is in a range of 1:1.4 to 1:1.6, inclusive. The ratio of the depth of the connecting hole K to the maximum radial dimension of the connecting hole K is in the range of 1:1.4 to 1:1.6, inclusive, so that the problem of the undercut in the connecting hole K may be further solved while preventing the wiring layout of the substrate 100 from being affected.

For example, the ratio of the depth of the connecting hole K to the maximum radial dimension of the connecting hole K is any one of 1:1, 1:1.5, or 1:2.

In summary, in the substrate 100 provided in some embodiments of the present disclosure, since the orthographic projection, on the first base 10, of the edge of the opening of the second via hole K2 at the side proximate to the first via hole K1 is substantially coincident with the orthographic projection, on the first base 10, of the edge of the opening of the first via hole K2 at the side proximate to the second via hole K2, the undercut structure may be prevented from existing at the interface position of the side wall of the first via hole K1 and the side wall of the second via hole K2, and the risk of breakage of the traces in the substrate 100 is reduced. Moreover, the ratio of the depth of the connecting hole K to the maximum radial dimension of the connecting hole K is in the range of 1:1 to 1:2, inclusive, so that the maximum radial dimension of the connecting hole is prevented from being too large, which is beneficial to the wiring layout of the substrate 100.

In some embodiments, referring to FIG. 2 again, the substrate 100 further includes a display area (active area, and also called as an active display area) AA, a bending area BB, and a bonding area ZZ. Referring to FIG. 3 again, the substrate 100 further includes a second fan-out area F2, and the second fan-out area F2 is adjacent to both an edge of the bending area BB and an edge of the bonding area ZZ. The bending area BB is adjacent to both an edge of the display area AA and an edge of the second fan-out area F2. A plurality of fan-out lines located in the second fan-out area F2 gradually approach and converge, and extend to the bonding area ZZ on a side of the second fan-out area F2 away from the display area AA, so that the plurality of fan-out lines are electrically connected to a driving chip (integrated circuit, IC) outside the substrate 100.

It will be noted that the bending area BB is adjacent to an edge of the display area AA, that is, an edge of the bending area BB proximate to the display area AA coincides with an edge of the display area AA proximate to the bending area BB. In the drawings of the present disclosure, taking FIG. 3 as an example, the edge of the bending area BB is separated from the edge of the display area AA, which is only for convenience of illustrating the display area AA and the bending area BB, and the display area AA and the bending area BB are not further limited. Similarly, the edges of the bending area BB and the second fan-out area F2 are separated from each other only for convenience of showing the bending area BB and the second fan-out area F2, and the edges of the second fan-out area F2 and the bonding area ZZ are separated from each other only for convenience of showing the second fan-out area F2 and the bonding area ZZ.

FIG. 3 shows an example in which the bending area BB is adjacent to the lower edge of the display area AA, some connecting holes K are located in the display area AA, and a second trace L2 is electrically connected to a first trace L1 through a connecting hole K. Positions of other connecting holes K will be described in detail later.

Figure 8:
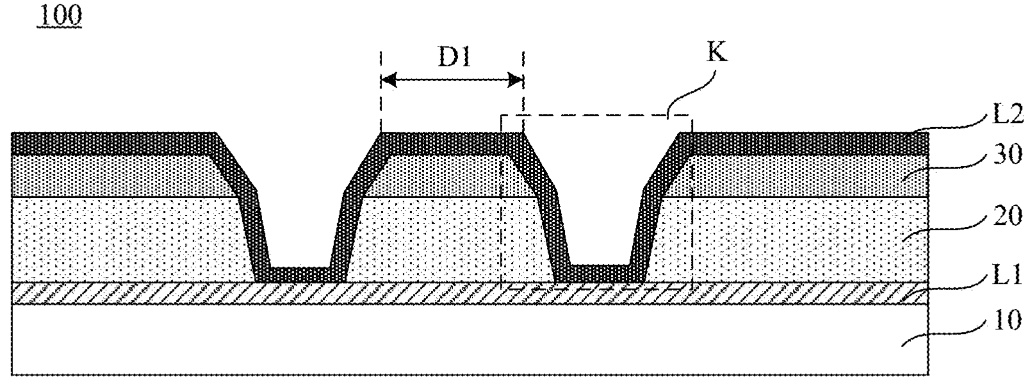
FIG. 8 is a sectional view of a local structure of a substrate provided in some other embodiments of the present disclosure.
Figure 9:
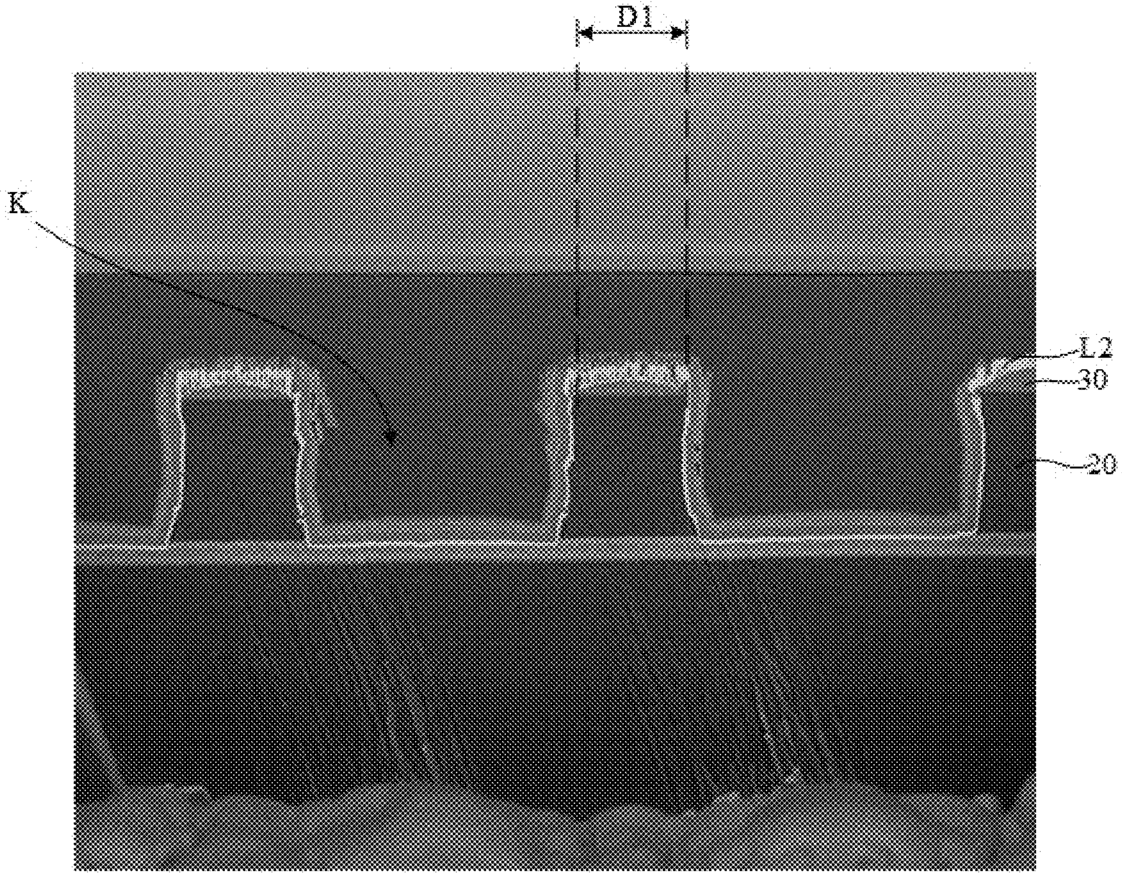
FIG. 9 is an electron micrograph of a substrate at a connecting hole thereof in some other implementations.
Figure 10:
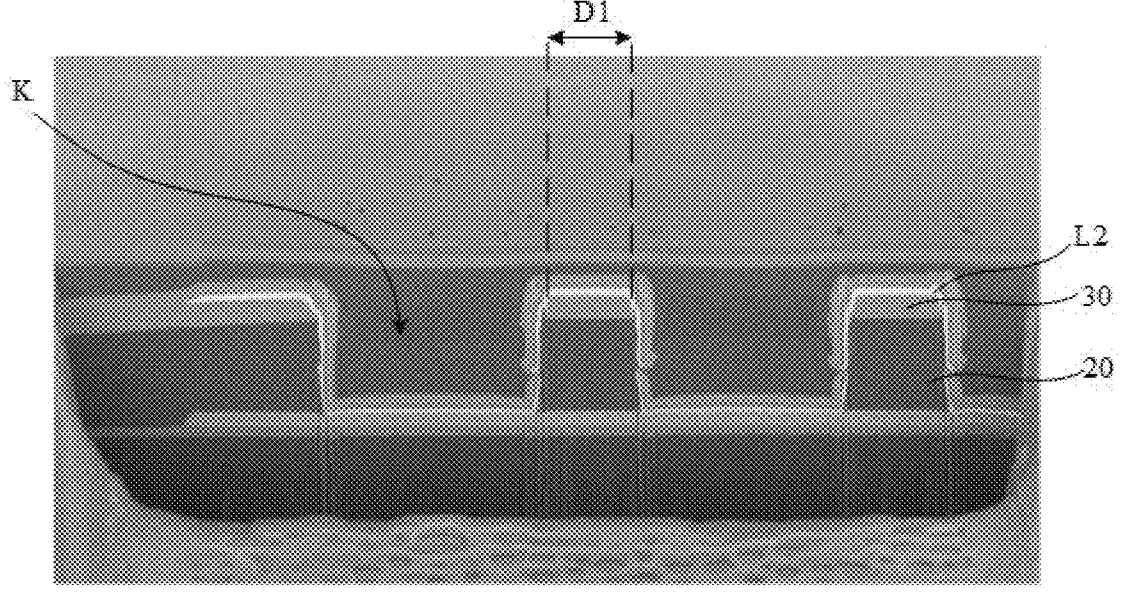
FIG. 10 is an electron micrograph of a substrate at a connecting hole thereof provided in some other embodiments of the present disclosure.

FIG. 8 is a sectional view of a local structure of a substrate provided in some other embodiments of the present disclosure. FIG. 9 is an electron micrograph of a substrate at a connecting hole thereof in some other implementations. FIG. 10 is an electron micrograph of a substrate at a connecting hole thereof provided in some other embodiments of the present disclosure. In some embodiments, referring to FIG. 8 again, the substrate 100 includes a plurality of connecting holes K, and a minimum distance D1 between two adjacent connecting holes K is greater than or equal to 3 μm.

Referring to FIG. 9, in a case where a minimum distance D1 between two adjacent connecting holes K is less than 3 μm, this causes the first inorganic layer 30 to burr at a location between the two adjacent connecting holes K. Obviously, a structure of the second trace L2 on the first inorganic layer 30 will be affected due to burrs, and the yield of the substrate 100 is reduced.

In embodiments of the present disclosure, referring to FIG. 10, a minimum distance D1 between two adjacent connecting holes K is set to be greater than or equal to 3 μm, which is beneficial to preventing the first inorganic layer 30 from forming burrs at a location between the two adjacent connecting holes K due to too small distance between the two adjacent connecting holes K, thereby improving the flatness of the first inorganic layer 30. That is, the flatness of the second trace L2 on the first inorganic layer 30 may be ensured, which is beneficial to improving the yield of the substrate 100.

For example, a minimum distance D1 between two adjacent connecting holes K is greater than or equal to 4 μm. The minimum distance D1 between the two adjacent connecting holes K is set to be relatively large, so that the first inorganic layer 30 may be further prevented from forming burrs at the position between the two adjacent connecting holes K, and the yield of the substrate 100 is improved.

For example, a minimum distance D1 between two adjacent connecting holes K is greater than or equal to 5 μm. The minimum distance D1 between the two adjacent connecting holes K is set to be larger, so that the first inorganic layer 30 may be further prevented from forming burrs at the position between the two adjacent connecting holes K, and the yield of the substrate 100 is improved.

In some embodiments, referring to FIG. 4 again, a slope angle of the first via hole K1 is in a range of 70 degrees (°) to 90 degrees (°), and/or a slope angle of the second via hole K2 is in a range of 70 degrees (°) to 90 degrees (°).

The structure of the connecting hole K as described above includes the following cases.

In the first case: the slope angle α1 of the first via hole K1 is in the range of 70° to 90°, inclusive. A thickness of the first organic layer 20 is generally a fixed value. For example, the thickness of the first organic layer 20 is in a range of 4 μm to 10 μm, inclusive. For example, the thickness of the first organic layer 20 is 5 μm. The first via hole K1 extends through the first organic layer 20. In a case where the slope angle α1 of the first via hole K1 is equal to or approaches 70°, the slope of the first via hole K1 is small, the maximum radial dimension of the first via hole K1 is large, and the orthographic projection, on the first base 10, of the edge of the opening of the second via hole K2 at the side proximate to the first via hole K1 is further substantially coincident with the orthographic projection, on the first base 10, of the edge of the opening of the first via hole K2 at the side proximate to the second via hole K2, so as to prevent the breakage of the second trace L2. Moreover, the maximum radial dimension of the first via hole K1 is not too large, the maximum radial dimension of the connecting hole K is reduced, and the wiring layout of the substrate 100 is facilitated. In a case where the slope angle α1 of the first via hole K1 is equal to or approaches 90°, the slope of the first via hole K1 is larger, and the maximum radial dimension of the first via hole K1 is smaller, that is, the maximum radial dimension of the connecting hole K may be further reduced, which is beneficial to the wiring layout of the substrate 100. Moreover, the maximum radial dimension of the first via hole K1 is not too small, so that the orthographic projection, on the first base 10, of the edge of the opening of the second via hole K2 at the side proximate to the first via hole K1 is further substantially coincident with the orthographic projection, on the first base 10, of the edge of the opening of the first via hole K2 at the side proximate to the second via hole K2, so as to prevent the breakage of the second trace L2.

In the second case: the slope angle α2 of the second via hole K2 is in the range of 70° to 90°, inclusive. A thickness of the first inorganic layer 30 is generally a fixed value. The second via hole K2 extends through the first inorganic layer 30. In a case where the slope angle α2 of the second via hole K2 is equal to or approaches 70°, the slope of the second via hole K2 is small, the maximum radial dimension of the second via hole K2 is large, and the orthographic projection, on the first base 10, of the edge of the opening of the second via hole K2 at the side proximate to the first via hole K1 is further substantially coincident with the orthographic projection, on the first base 10, of the edge of the opening of the first via hole K2 at the side proximate to the second via hole K2, so as to prevent the breakage of the second trace L2. Moreover, the maximum radial dimension of the second via hole K2 is not too large, the maximum radial dimension of the connecting hole K is reduced, and the wiring layout of the substrate 100 is facilitated. In a case where the slope angle α2 of the second via hole K2 is equal to or approaches 90°, the slope of the second via hole K2 is larger, and the maximum radial dimension of the second via hole K2 is smaller, that is, the maximum radial dimension of the connecting hole K may be further reduced, which is beneficial to the wiring layout of the substrate 100. Moreover, the maximum radial dimension of the second via hole K2 is not too small, so that the orthographic projection, on the first base 10, of the edge of the opening of the second via hole K2 at the side proximate to the first via hole K1 is further substantially coincident with the orthographic projection, on the first base 10, of the edge of the opening of the first via hole K2 at the side proximate to the second via hole K2, so as to prevent the breakage of the second trace L2.

In the third case: the slope angle α1 of the first via hole K1 is in the range of 70° to 90°, inclusive, and the slope angle α2 of the second via hole K2 is in the range of 70° to 90°, inclusive. Since the first via hole K1 and the second via hole K2 form the connecting hole K, a shape of the connecting hole K may be defined and adjusted by defining both the slope angle α1 of the first via hole K1 and the slope angle α2 of the second via hole. Also, a structure in the third case has the effects of structures in the first and second cases as described above.

It can be understood that, in any of the above structures, the problem that the side wall of the first via hole K1 and the side wall of the second via hole K2 have an undercut structure at an interface position therebetween to cause the breakage of the second trace L2 may be prevented. Moreover, the maximum radial dimension of the connecting hole K is reduced to a certain extent, which is beneficial to the wiring layout of the substrate 100.

For example, the slope angle of the first via hole K1 is in a range of 73° to 88°, inclusive; and/or the slope angle of the second via hole K2 is in a range of 73° to 88°, inclusive. That is, the slope angle of the first via hole K1 is in the range of 73° to 88°, inclusive; alternatively, the slope angle of the second via hole K2 is in the range of 73° to 88°, inclusive; alternatively, the slope angle of the first via hole K1 is in the range of 73° to 88°, inclusive; and the slope angle of the second via hole K2 is in the range of 73° to 88°, inclusive. By setting the first via hole K1 and/or the second via hole K2 in the above-mentioned ranges, the slope of the connecting hole K formed by the first via hole K1 and the second via hole K2 can be relatively gentle, which facilitates the subsequent formation of the second trace L2, and also facilitates the reduction of the maximum radial dimension of the connecting hole K, thereby facilitating the wiring layout of the substrate 100.

For example, the slope angle of the first via hole K1 is in a range of 75° to 85°, inclusive; and/or the slope angle of the second via hole K2 is in a range of 75° to 85°, inclusive. That is, the slope angle of the first via hole K1 is in the range of 75° to 85°, inclusive; alternatively, the slope angle of the second via hole K2 is in the range of 75° to 85°, inclusive; alternatively, the slope angle of the first via hole K1 is in the range of 75° to 85°, inclusive; and the slope angle of the second via hole K2 is in the range of 75° to 85°, inclusive. By setting the first via hole K1 and/or the second via hole K2 in the above-mentioned ranges, the slope of the connecting hole K formed by the first via hole K1 and the second via hole K2 can be gentle, while facilitating the reduction of the maximum radial dimension of the connecting hole K, thereby facilitating the wiring layout of the substrate 100.

For example, the slope angle of the first via hole K1 is in a range of 78° to 82°, inclusive; and/or the slope angle of the second via hole K2 is in a range of 78° to 82°, inclusive. That is, the slope angle of the first via hole K1 is in the range of 78° to 82°, inclusive; alternatively, the slope angle of the second via hole K2 is in the range of 78° to 82°, inclusive; alternatively, the slope angle of the first via hole K1 is in the range of 78° to 82°, inclusive; and the slope angle of the second via hole K2 is in the range of 78° to 82°, inclusive. By setting the first via hole K1 and/or the second via hole K2 in the above-mentioned ranges, the maximum radial dimension of the connecting hole K formed by the first via hole K1 and the second via hole K2 can be gentle, and the problem of the undercut in the connecting hole K can be well solved while the wiring layout of the substrate 100 is not affected.

For example, the slope angle $\alpha$1 of the first via hole K1 is any one of 70°, 80°, or 90°.

For example, the slope angle $\alpha$2 of the second via hole K2 is any one of 70°, 80°, or 90°.

For example, the slope angle $\alpha$2 of the second via hole K2 may be the same as the slope angle $\alpha$1 of the first via hole K1. It can be understood that in some other embodiments, the slope angle $\alpha$2 of the second via hole K2 may be different from the slope angle $\alpha$1 of the first via hole K1, which is not limited in the embodiments of the present disclosure.

Figure 11:
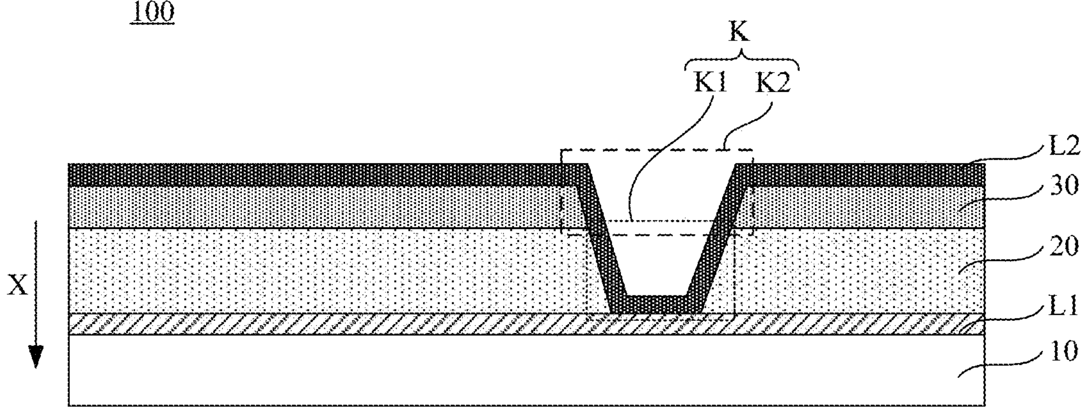
FIG. 11 is a sectional view of a local structure of a substrate provided in yet some other embodiments of the present disclosure.

FIG. 11 is a sectional view of a local structure of a substrate provided in yet some other embodiments of the present disclosure. In some embodiments, referring to FIG. 11, along a direction X from the first organic layer 20 toward the first base 10, opening areas of the connecting hole K gradually decrease.

FIG. 11 shows an example in which the side wall of the connecting hole K is an inclined surface. In this case, the "inclined surface" means that slopes of the side wall of the connecting hole K at various positions are the same. It can be understood that in some other embodiments, the side wall of the connecting hole K may be an arc-shaped surface. Here, the "arc-shaped surface" means that slopes of the side wall of the connecting hole K at various positions are different. For example, along a direction from the first base 10 toward the first inorganic layer 30, slopes of the side wall gradually increase.

Along the direction from the first organic layer 20 toward the first base 10, the opening areas of the connecting hole K gradually decrease. That is, the radial dimension of the connecting hole K formed by the first via hole K1 and the second via hole K2 is gradually changed, so that the connecting hole K forms a smooth side wall, thereby preventing the undercut structure. Therefore, when the second trace L2 is formed on the first inorganic layer 30, the second trace L2 can be connected to the first trace along the connecting hole K, so as to reduce the problem of breakage of the second trace L2.

Figure 12:
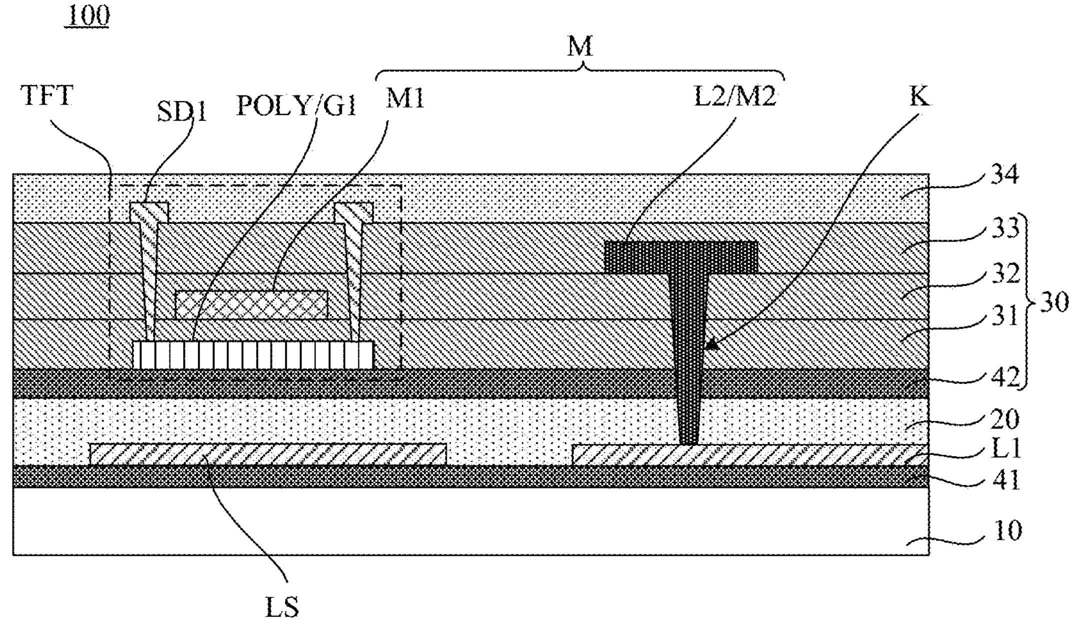
FIG. 12 is a sectional view of a local structure of a substrate provided in yet some other embodiments of the present disclosure.

FIG. 12 is a sectional view of a local structure of a substrate provided in yet some other embodiments of the present disclosure. In some embodiments, referring to FIG. 12, the first organic layer 20 is a second base. The first trace L1 is located between the first base 10 and the second base. The substrate 100 further includes: a plurality of conductive layers M. The plurality of conductive layers M are stacked on a side of the first organic layer 20 away from the first base 10. The second trace L2 is located in any one of the conductive layers M.

In some examples, the substrate 100 further includes: a plurality of conductive layers M. For example, a conductive layer M includes signal lines, such as data signal lines or power signal lines, for transmitting signals to drive the substrate 100. The second trace L2 is located in any one of the conductive layers M, that is, a signal line serving as the second trace L2 in any one of the conductive layers M may be electrically connected to the first trace L1 through the connecting hole K, so that a signal on a signal line in a conductive layer M is transferred to a signal line in another layer, and the wiring layout of the substrate 100 is facilitated.

For example, materials of the first organic layer 20 and the first base 10 may be same. It can be understood that in some other embodiments, the material of the first organic layer 20 may be different from the material of the first base 10.

In some examples, the substrate 100 further includes a first barrier layer 41, the first barrier layer 41 is located between the first base 10 and the first trace L1. The first organic layer 20 is a second base. The first base 10, the first barrier layer 41 and the first organic layer 20 form a flexible base.

For example, the first inorganic layer 30 further includes a second barrier layer 42. A material of first barrier layer 41 and/or the second barrier layer 42 includes silicon oxide (SiOx) and silicon nitride (SiNx).

In some embodiments, referring to FIG. 12 again, the plurality of conductive layers M includes a first gate metal layer (i.e., a first gate conductive layer) M1 and a second gate metal layer (i.e., a second gate conductive layer) M2, and the second trace L2 is located in the second gate metal layer M2.

For example, the second trace L2 may be a data signal line located in the second gate metal layer M2, and the second trace L2 is connected to the first trace L1 through the connecting hole K1, which is beneficial to the trace layout of the substrate 100.

For example, a material of the first gate conductive layer M1 includes a conductive metal. The conductive metal may include at least one of aluminum, copper, or molybdenum. The second gate conductive layer M2 may be made of a same material as the first gate conductive layer M1. It can be understood that in some other embodiments, the second gate conductive layer M2 may be made of a material different from that of the first gate conductive layer M1, which is not limited in the embodiments of the present disclosure.

The first inorganic layer 30 includes one or more of a first gate insulating layer 31, a second gate insulating layer 32 and an interlayer dielectric layer 33.

For example, the first inorganic layer 30 may be one of the first gate insulating layer 31, the second gate insulating layer 32, and the interlayer dielectric layer 33. Alternatively, the first inorganic layer 30 includes two or more of the first gate insulating layer 31, the second gate insulating layer 32, and the interlayer dielectric layer 33. For example, the first inorganic layer 30 includes the first gate insulating layer 31, the second gate insulating layer 32, and the interlayer dielectric layer 33. The specific number of film layers in the first inorganic layer 30 is not limited in the present disclosure, and may be adjusted according to the position of the second trace L2, that is, the first inorganic layer 30 may be an inorganic layer between the second trace L2 and the first organic layer 20. The gate insulating layer 31 is located between the first organic layer 20 and the first gate metal layer M1. For example, a material of the first gate insulating layer 31 includes an inorganic insulating material, such as any of silicon nitride, silicon oxynitride and silicon oxide. The material of the first gate insulating layer 31 may include silicon dioxide, and the present disclosure is not limited thereto. The first gate insulating layer 31 electrically insulates the first gate metal layer M1 from a film layer on a side of the first gate insulating layer 31 proximate to the first base 10. For example, the substrate 100 further includes an active layer between the first gate metal layer M1 and the first base 10, and the first gate insulating layer 31 electrically insulates the first gate metal layer M1 from the active layer.

The second gate insulating layer 32 is located between the first gate metal layer M1 and the second gate metal layer M2. The second gate insulating layer 32 electrically insulates the first gate metal layer M1 from the second gate metal layer M2. A material of the second gate insulating layer 32 includes an inorganic insulating material, such as any of silicon nitride, silicon oxynitride and silicon oxide. The material of the second gate insulating layer 32 may include silicon dioxide, and the present disclosure is not limited thereto.

The interlayer dielectric layer 33 is located on a side of the gate metal layer M2 away from the first base 10. For example, a material of the interlayer dielectric layer 33 may be silicon oxide (SiOx). The interlayer dielectric layer 33 electrically insulates the second gate metal layer M2 from a film layer on a side of the interlayer dielectric layer 33 away from the first base 10. For example, the substrate 100 further includes a first source-drain metal layer SD1 located on a side of the second gate metal layer M2 away from the first base 10, and the interlayer dielectric layer 33 electrically insulates the second gate metal layer M2 from the first source-drain metal layer SD1.

In some examples, the substrate 100 further includes a first planarization layer 34, and the first planarization layer 34 is located on a side of the first source-drain metal layer SD1 away from the first base 10.

In some examples, referring to FIG. 12 again, the plurality of conductive layers M further include a third gate metal layer, a first source-drain metal layer, a second source-drain metal layer, and the like, which are located on a side of the second gate metal layer M2 away from the first base 10. Since the third gate metal layer, the first source-drain metal SD1, the second source-drain metal layer, and the like are spaced with multiple film layers from the first trace L1, it is not conducive to an electrical connection of a signal line directly through a single via hole. The signal line in a metal layer such as the third gate metal layer, the first source-drain metal SD1, or the second-source drain metal layer may be connected to the second gate metal layer M2 first, and then to the first trace L1 through the second gate metal layer M2.

In some embodiments, referring to FIG. 12 again, the plurality of conductive layers M includes an active layer POLY. The substrate 100 further includes a light-shielding pattern LS (also referred to as bottom shield metal, BSM for short), which is arranged in a same layer as the first trace L1. Here, an orthographic projection of a channel portion G1 of the active layer POLY on the first base 10 is located within an orthographic projection of the light-shielding pattern LS on the first base 10.

In some examples, referring to FIG. 12 again, the substrate 100 includes an active layer POLY, a first gate insulating layer 31, a first gate metal layer M1, a second gate insulating layer 32, a second gate metal layer M2, an interlayer dielectric layer 33, a first source-drain metal layer SD1, and a first planarization layer 34 that are sequentially stacked on the first organic layer 20. The substrate 100 further includes at least one transistor TFT, a transistor TFT includes a gate electrode located in the first gate metal layer M1, a source electrode and a drain electrode located in the first source-drain metal layer SD1, and further includes a channel portion G1 of the active layer POLY. Since a material of the active layer POLY is sensitive to light, the difference of the electrical characteristics is large when the active layer POLY is irradiated by light with different intensities. To avoid the problem that in the active layer POLY, channel portions of various transistors are affected by light during use, in embodiments of the present disclosure, the light-shielding pattern LS is provided between the first base 10 and the active layer POLY, an orthographic projection of the light-shielding pattern LS on the first base 10 has an overlap with an orthographic projection of the active layer POLY on the first base 10. The light-shielding pattern LS may prevent external light from affecting the channel portion. The light-shielding pattern LS and the first trace L1 are arranged in a same layer, and the light-shielding pattern LS and the first trace L1 may have a layer structure formed by a single patterning process using a same mask, which is beneficial to simplifying the manufacturing process of the substrate 100.

For example, as the material of the active layer POLY is continuously operated, $H_2O$, F ions, and H atoms in the substrate 100 are diffused due to the voltage applied to the gate electrode, which causes a threshold voltage (Vth) of the transistor TFT to be negatively biased, thereby causing the lifetime of the transistor TFT to be reduced. In a case where the substrate 100 is used in the display panel 200, the display panel 200 may have a problem of uneven gray scale of a display image. To avoid the above problem, the light-shielding pattern LS may give a constant potential at the channel portion G1, which may be used to improve the problem of the threshold voltage (Vth) being negatively biased, thereby alleviating the above aging process.

Figure 13:
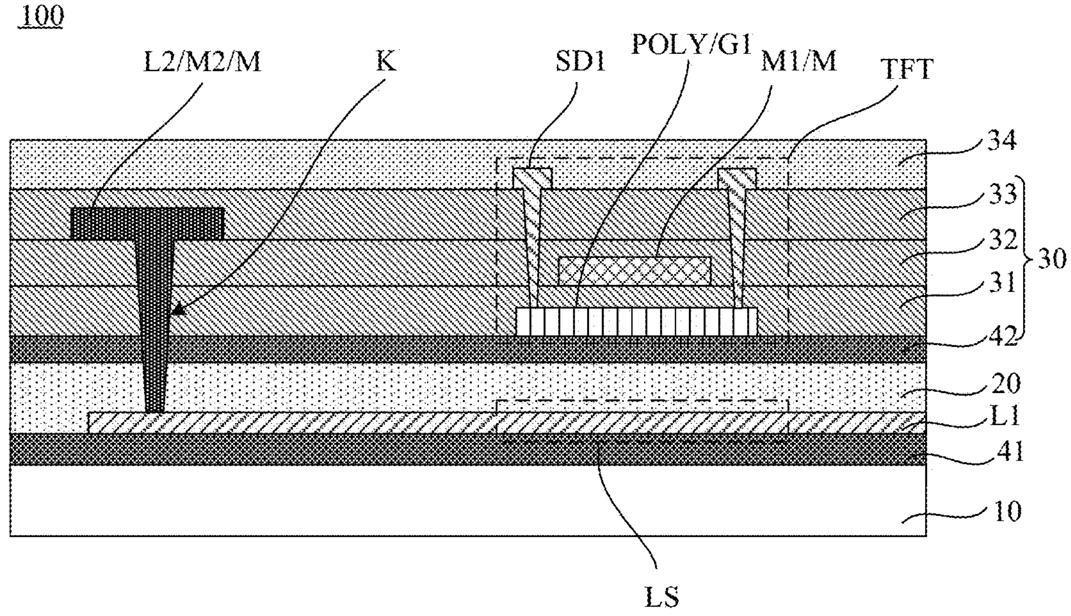
FIG. 13 is a sectional view of a local structure of a substrate provided in yet some other embodiments of the present disclosure.

FIG. 13 is a sectional view of a local structure of a substrate provided in yet some other embodiments of the present disclosure. In some examples, referring to FIG. 13, the first trace L1 is located between the first base 10 and the first organic layer 20, and the first trace L1 is a metal trace and is made of a light-shielding material. Therefore, an orthographic projection of the first trace L1 on the first base 10 may be arranged to have an overlap with an orthographic projection of the active layer POLY on the first base 10. That is, the first trace L1 is used as the light-shielding pattern LS, which is beneficial to simplifying the manufacturing process of the substrate 100.

For example, a portion of the first trace L1, whose orthographic projection on the first base 10 overlaps with the orthographic projection of the active layer POLY on the first base 10, may be widened, so that the orthographic projection of the active layer POLY on the first base 10 may completely fall within the orthographic projection of the first trace L1 on the first base 10, and channel portions G1 of various transistors in the active layer POLY may be completely prevented from being affected by light during use.

Figure 14:
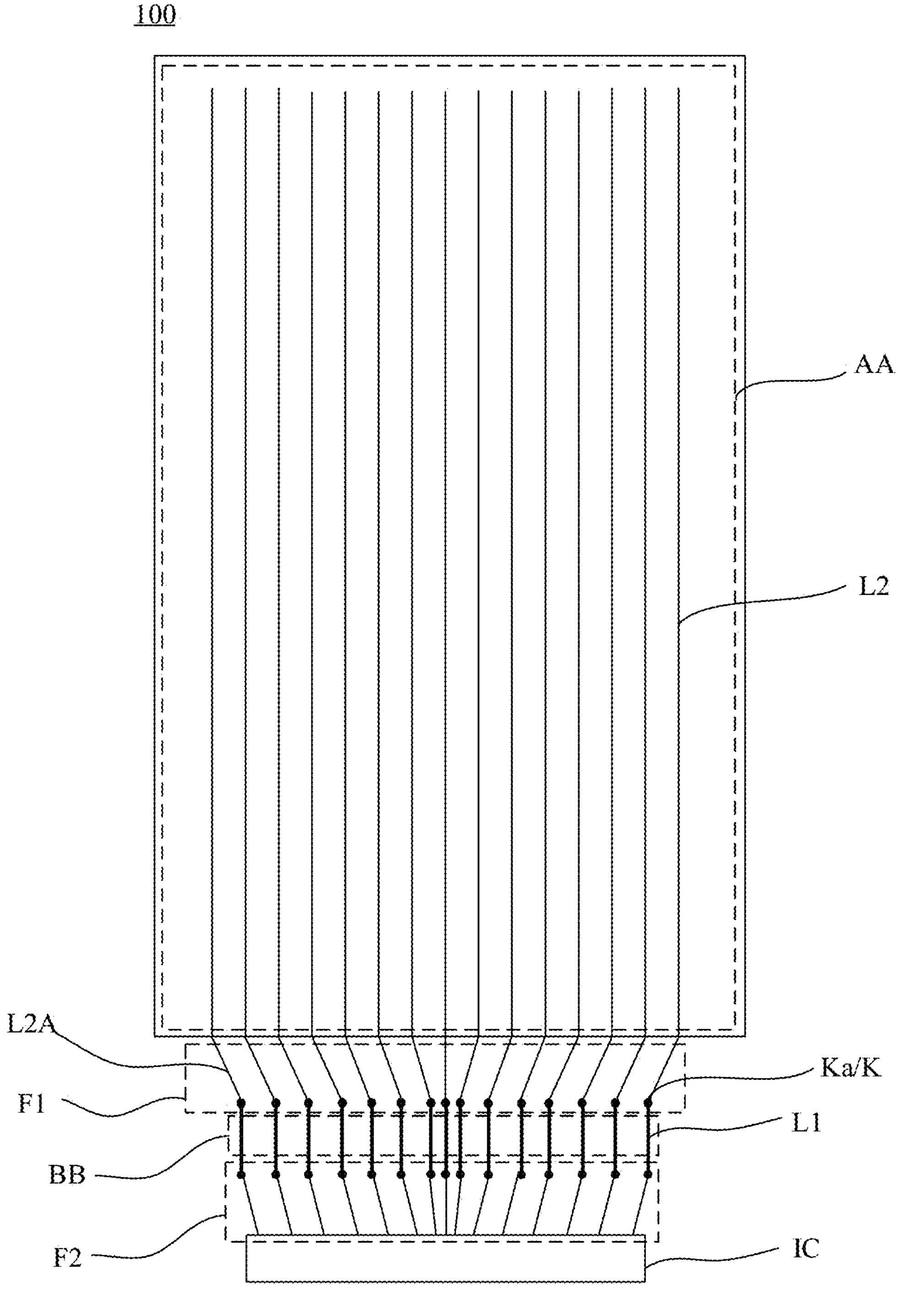
FIG. 14 is a structural diagram of a substrate provided in some other embodiments of the present disclosure.

FIG. 14 is a structural diagram of a substrate provided in some other embodiments of the present disclosure. In some embodiments, referring to FIG. 14, the substrate 100 further includes: a display area AA, a first fan-out area F1, and a bending area BB. The first fan-out area F1 is located between the display area AA and the bending area BB. The second trace L2 is located in the display area AA and extends to the first fan-out area F1. The first trace L1 is located in the bending area BB, and one end of the first trace L1 extends to the first fan-out area F1. At least one connecting hole K is a first-type connecting hole Ka, and the first-type connecting hole Ka is located in the first fan-out area F1. The portion of the first trace L1 located in the first fan-out area F1 is electrically connected to a portion of the second trace L2 located in the first fan-out area F1 through the first-type connecting hole Ka.

One end L2A of the second trace L2 extends to the first fan-out area F1, and the one end L2A of the second trace L2 is electrically connected to the first trace L1 through a first-type connecting hole Ka located in the first fan-out area F1. That is, the second trace L2 located in the second gate conductive layer M2 is switched to the first trace L1 located between the two bases. The second trace L2 may be prevented from being affected by the problems of the first planarization layer 34, the interlayer dielectric layer 33, the second gate insulating layer 32 and the first gate insulating layer 31 being broken, and the second trace L2 may be prevented from being broken.

It will be noted that the first fan-out area F1 is adjacent to an edge of the display area AA, that is, an edge of the first fan-out area F1 proximate to the display area AA coincides with an edge of the display area AA proximate to the first fan-out area F1. In the drawings of the present disclosure, taking FIG. 8 as an example, the edge of the first fan-out area F1 and the edge of the display area AA are separated from each other only for convenience of illustrating the display area AA and the first fan-out area F1, and the display area AA and the first fan-out area F1 are not further limited. Similarly, the edges of the first fan-out area F1 and the bending area BB are separated from each other only for convenience of illustrating the first fan-out area F1 and the bending area BB.

In some embodiments, referring to FIG. 3 again, the substrate 100 further includes: a display area AA and a bending area BB. The second trace L2 is located in the display area AA. The first trace L1 is located in the bending area BB, and one end L1A of the first trace L1 extends to the display area AA. At least one connecting hole K is a second-type connecting hole Kb, and the second-type connecting hole Kb is located in the display area AA. The portion L1A of the first trace L1 located in the display area AA is electrically connected to the second trace L2 through the second-type connecting hole K.

Based on the above structure, the second trace L2 is electrically connected to the first trace L1 through the second-type connecting hole Kb located in the display area AA, so as to realize the fan-out trace convergence effect. Compared to a manner in which fan-out traces are converged at the lower edge of the display area AA, the above structure can reduce an area of a portion of the lower frame occupied by the fan-out traces, thus facilitating the reduction of the lower frame of the substrate 100 to achieve a narrow frame of the substrate 100.

To clearly show locations of the first trace L1 and the second trace L2, FIG. 3 shows an example in which there are only six first traces L1. Embodiments of the present disclosure do not limit the number of first traces L1, which may be set correspondingly to the number of second traces L2 that need to be switched.

Figure 15:
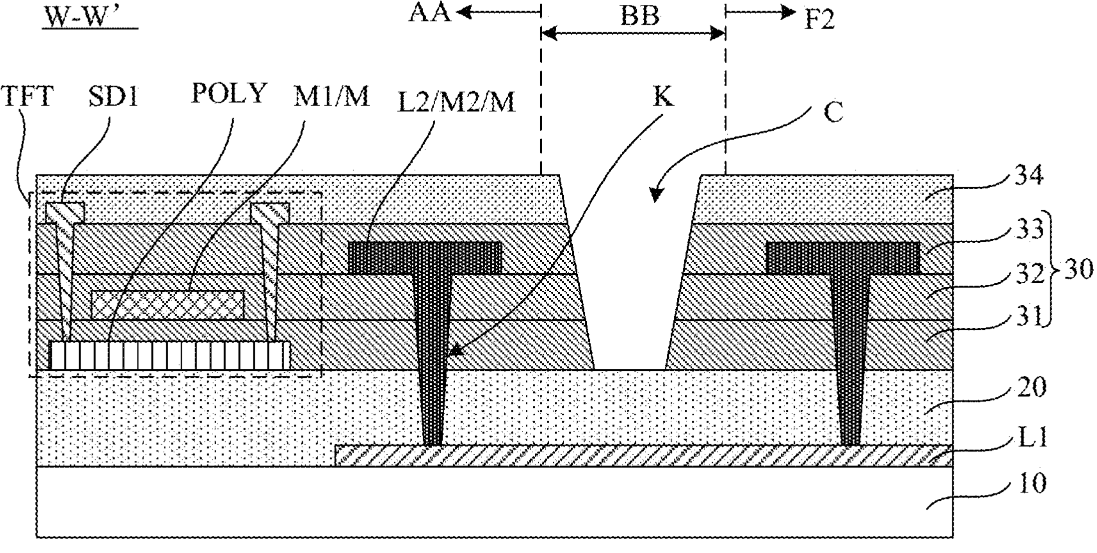
FIG. 15 is a sectional view taken along the line W-W in FIG. 3.

FIG. 15 is a sectional view taken along the line W-W' in FIG. 3. In some examples, referring to FIG. 15, the substrate 100 includes a bending area BB. The substrate 100 further includes a through hole C, the through hole C is located in the bending area BB, and the through hole C sequentially extends through the first planarization layer 34, the interlayer dielectric layer 33, the second gate insulating layer 32 and the first gate insulating layer 31. The problem of breakage of the first planarization layer 34, the interlayer dielectric layer 33, the second gate insulating layer 32, the first gate insulating layer 31, and the like may be prevented, and the service life of the substrate 100 may be improved.

For example, the through-hole C may be filled with an organic material. The organic material is used to release the stress of the bending area BB, which is beneficial to improving the bending performance of the substrate 100 in the bending area BB. For example, the organic material may include one or more of a polyacryl-based resin, a polyimide-based resin, a polyamide-based resin, a siloxane-based resin, an acryl-based resin, and an epoxy-based resin.

For example, a portion of the first trace L1 located in the bending area BB may include an opening, so as to release the stress of the bending area BB through the opening, thereby reducing the risk of breakage of the first trace L1.

Figure 16:
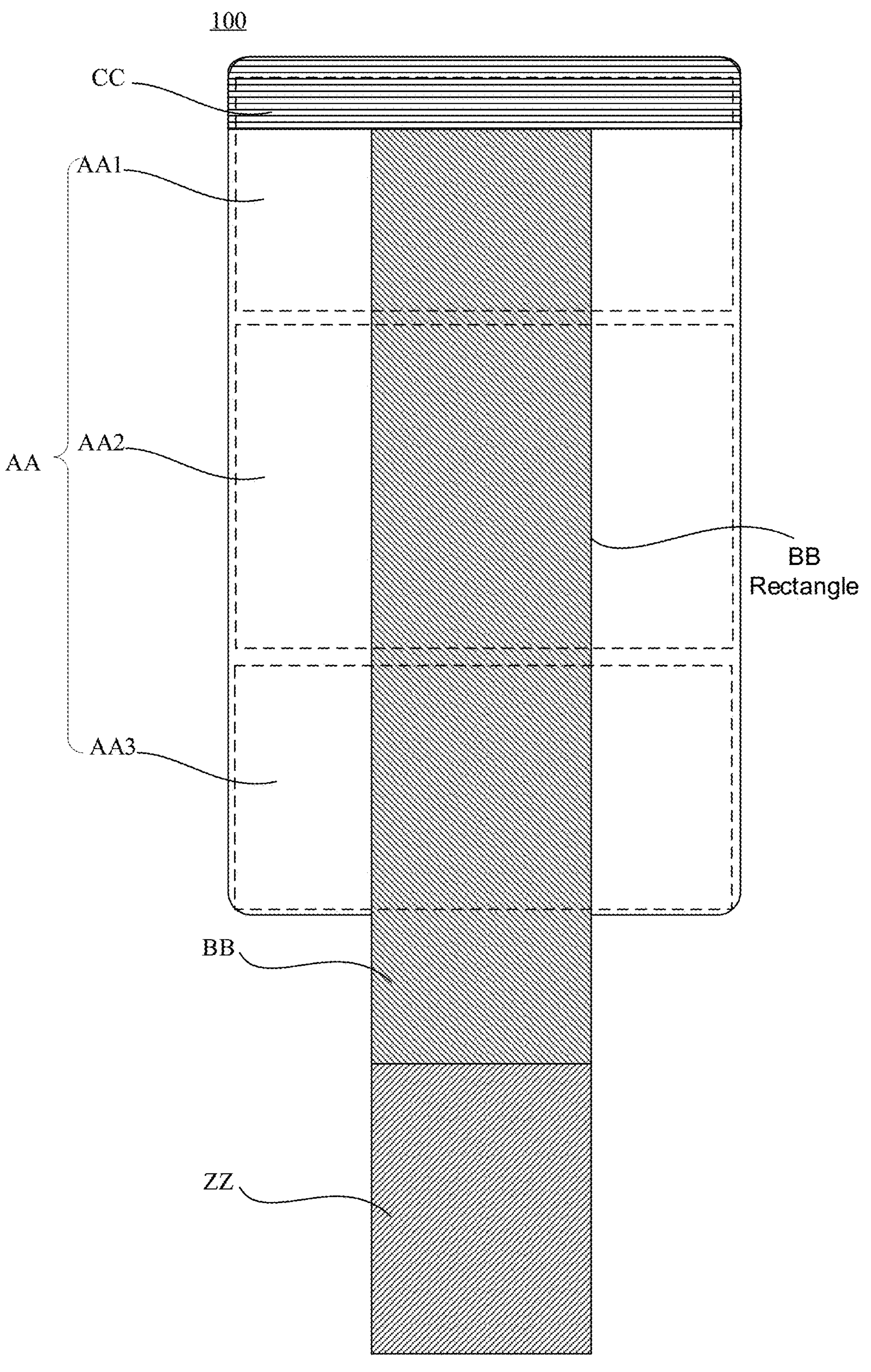
FIG. 16 is a structural diagram of a substrate provided in yet some other embodiments of the present disclosure.
Figure 17:
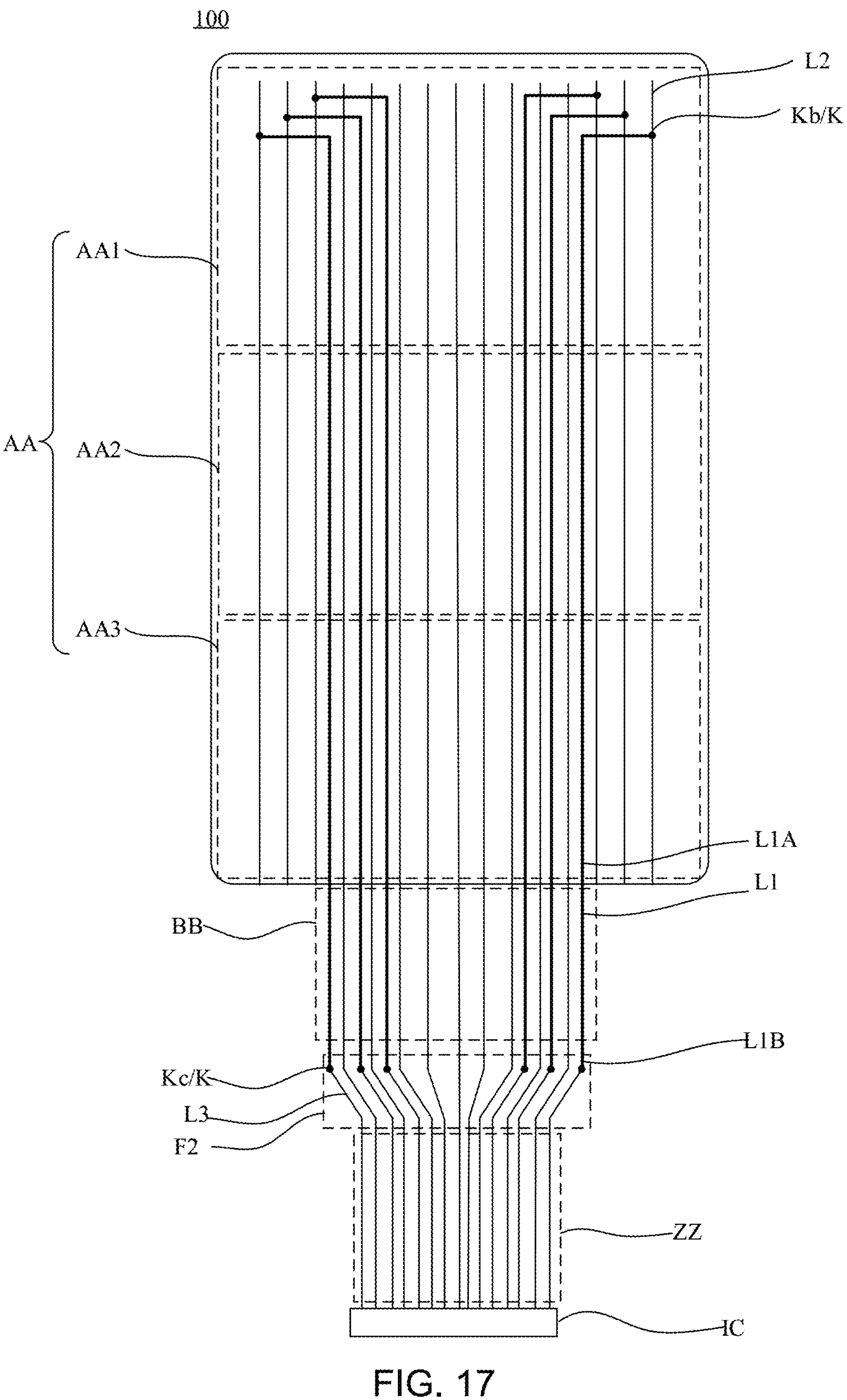
FIG. 17 is a structural diagram of the substrate in FIG. 16.
Figure 18:
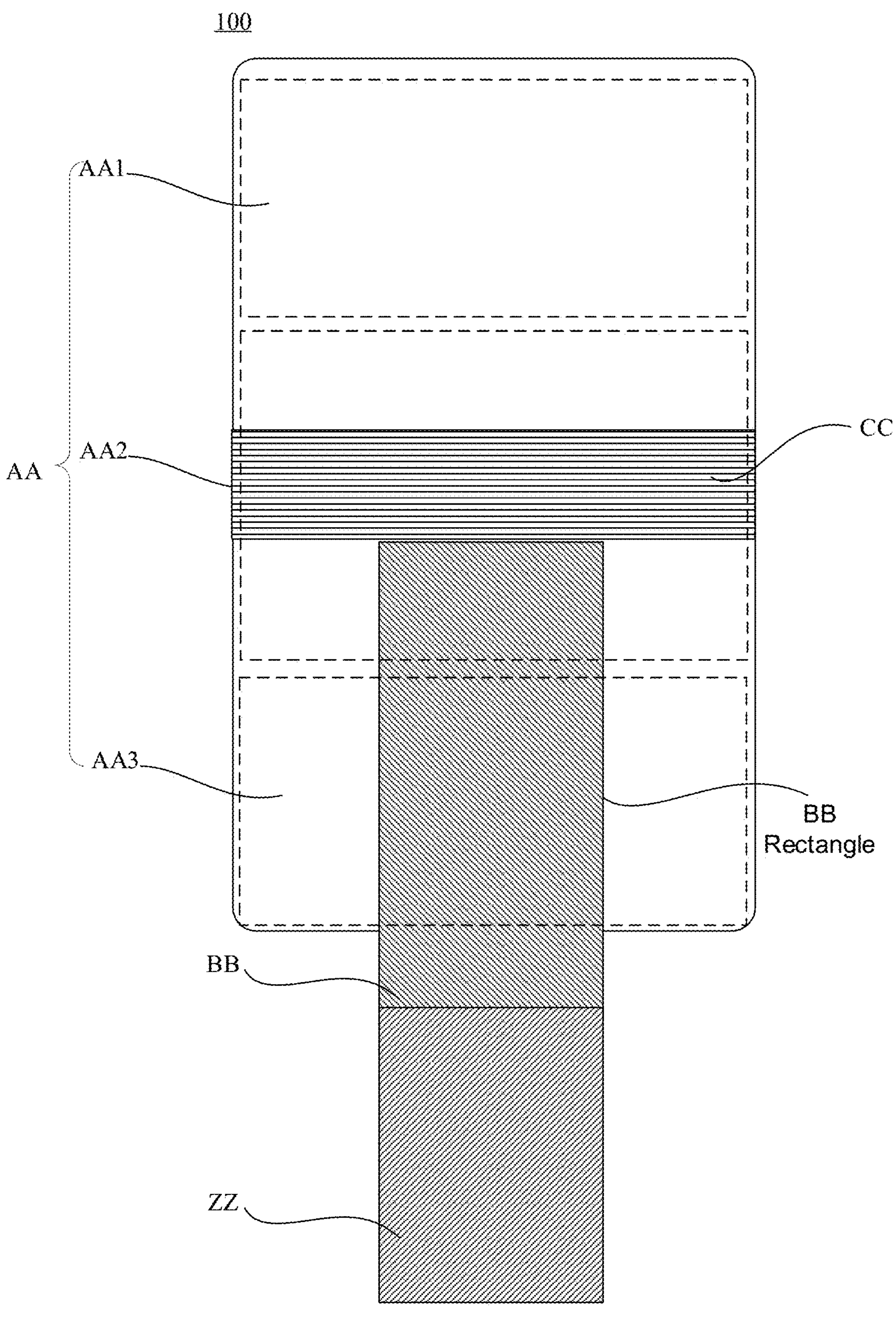
FIG. 18 is a structural diagram of a substrate provided in yet some other embodiments of the present disclosure.
Figure 19:
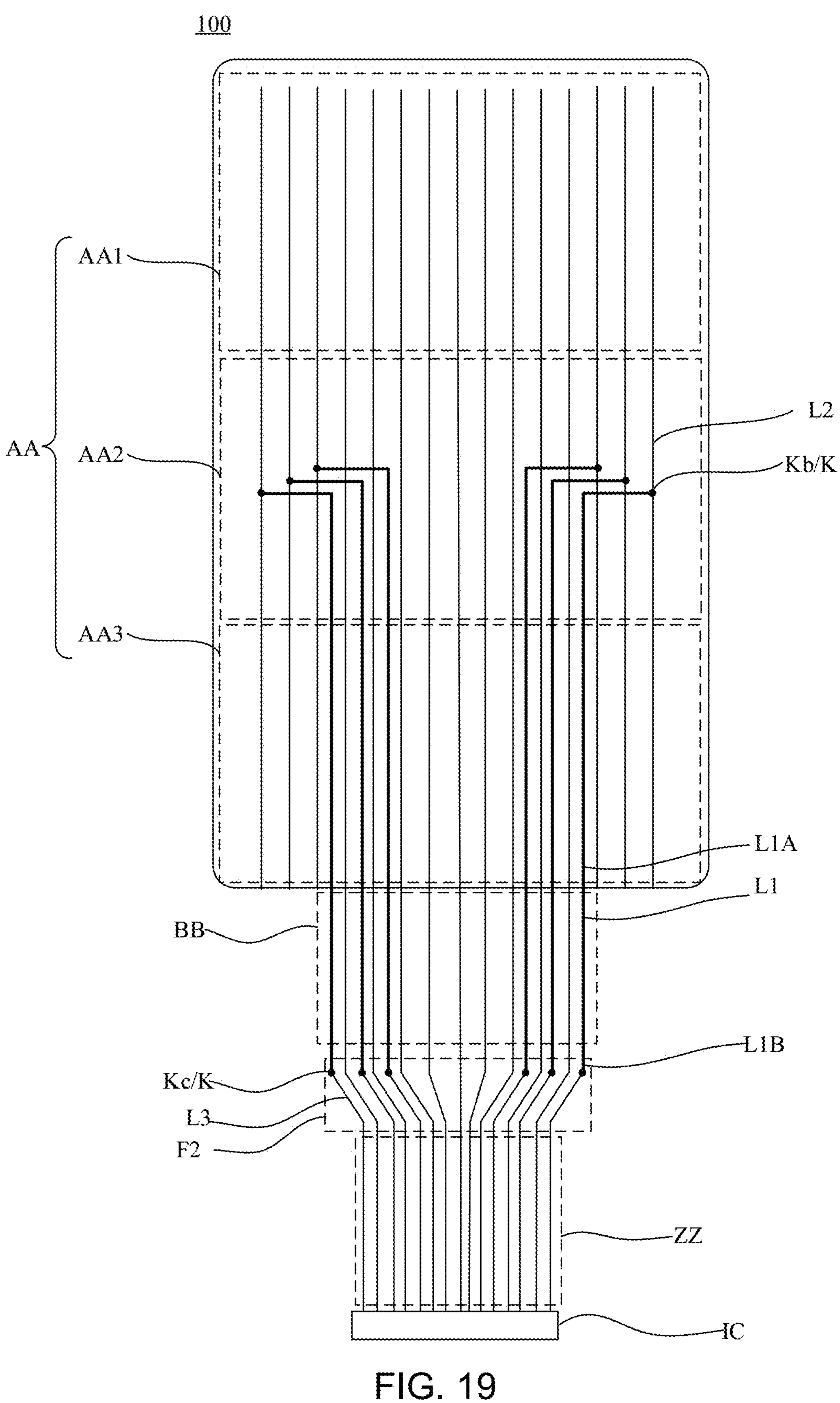
FIG. 19 is a structural diagram of the substrate in FIG. 18.
Figure 20:
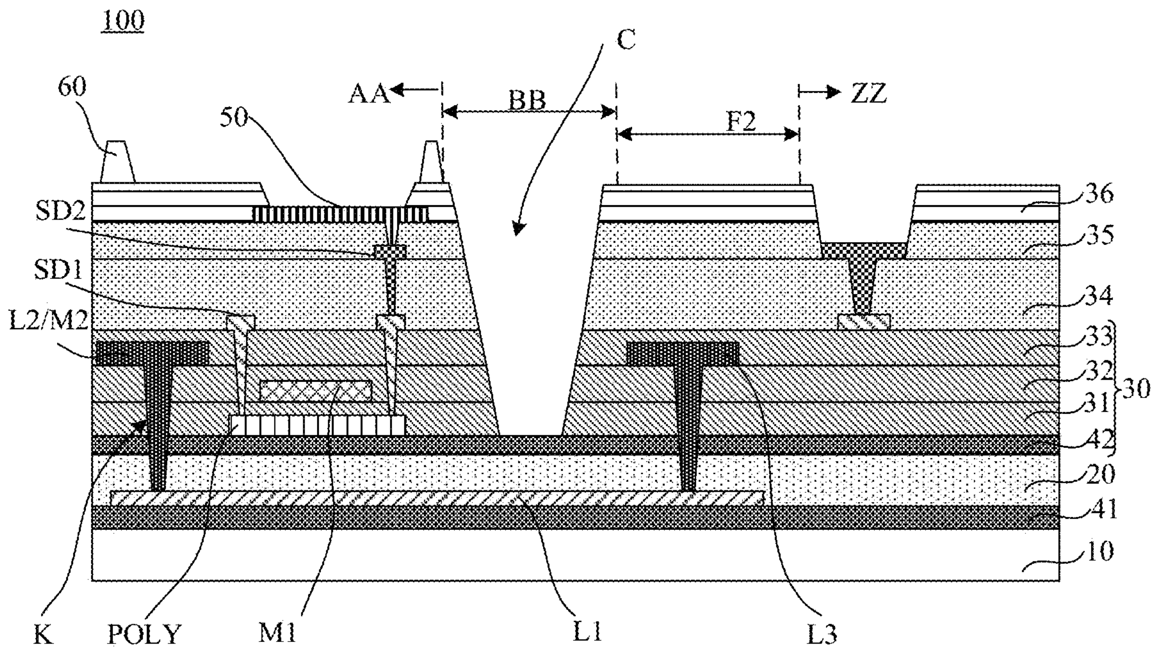
FIG. 20 is a sectional view of a local structure of a substrate provided in yet some other embodiments of the present disclosure.
Figure 21:
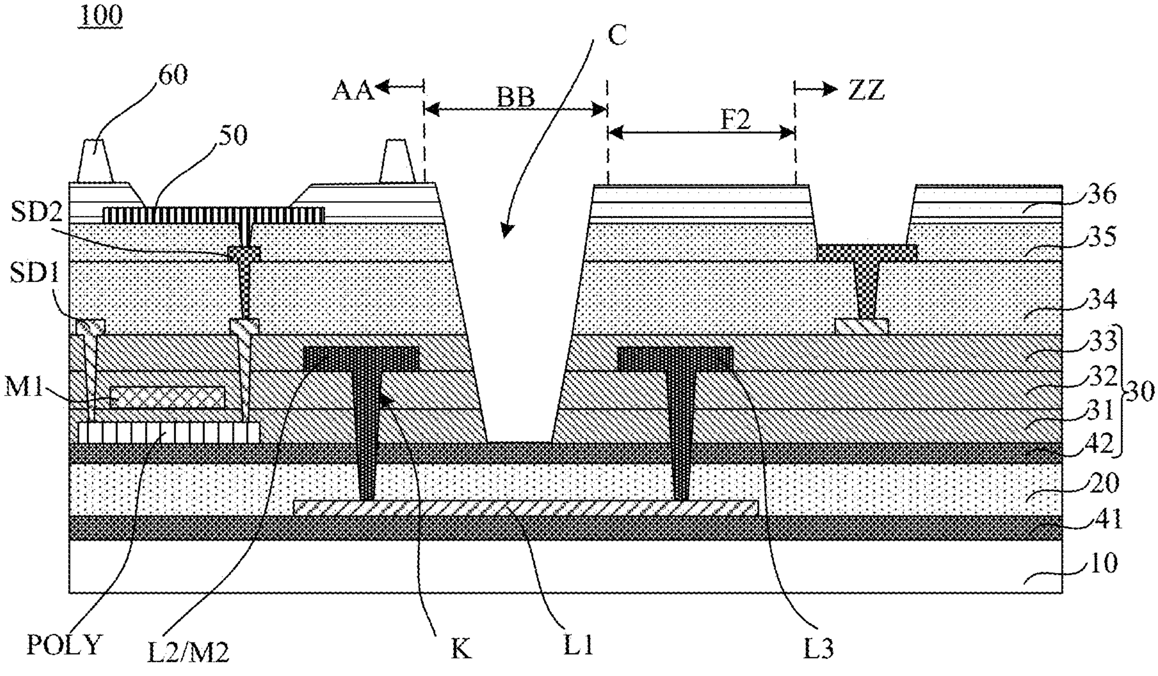
FIG. 21 is a sectional view of a local structure of a substrate provided in yet some other embodiments of the present disclosure.

FIG. 16 is a structural diagram of a substrate provided in yet some other embodiments of the present disclosure. FIG. 17 is a structural diagram of the substrate in FIG. 16. FIG. 18 is a structural diagram of a substrate provided in yet some other embodiments of the present disclosure. FIG. 19 is a structural diagram of the substrate in FIG. 18. FIG. 20 is a sectional view of a local structure of a substrate provided in yet some other embodiments of the present disclosure. FIG. 21 is a sectional view of a local structure of a substrate provided in yet some other embodiments of the present disclosure. FIG. 20 is a sectional view of the substrate 100 in a case where the connecting hole K is located in the first display region AA1 or the connecting hole K is located in the second display region AA2. FIG. 21 is a sectional view of the substrate 100 in a case where the connecting hole K is located in the third display region AA3. FIG. 17 and FIG. 19 each show one arrangement manner of connecting holes K, first traces L1 and second traces L2 in detail. In FIG. 16 and FIG. 18, the region CC is provided therein with a connecting hole K (not shown in FIG. 16 and FIG. 18), and the specific position of the connecting hole K may be shown in combination with FIG. 17 and FIG. 19. In some examples, referring to FIG. 2 and FIG. 16 to FIG. 19, the display area AA includes a first display region AA1, a second display region AA2, and a third display region AA3. The second display region AA2 is located between the first display region AA1 and the third display region AA3, and the third display region AA3 is closest to the bending area BB. The second-type connecting hole Kb is located in any one of the first display region AA1, the second display region AA2, and the third display region AA3.

It will be noted that the second display region AA2 is located between the first display region AA1 and the third display region AA3, and an edge of the second display region AA2 proximate to the first display region AA1 coincides with an edge of the first display region AA1 proximate to the second display region AA2. The other edge of the second display region AA2 proximate to the third display region AA3 coincides with an edge of the third display region AA3 proximate to the second display region AA2. In the drawings of the present disclosure, taking FIG. 2 as an example, the second display region AA2 is separated from both the first display region AA1 and the third display region AA3, which are only for convenience of illustrating the first display region AA1, the second display region AA2 and the third display region AA3, and the first display region AA1, the second display region AA2 and the third display region AA3 are not further limited.

Referring to FIG. 17 again, FIG. 17 shows an example in which second-type connecting holes Kb are located in the first display region AA1. Since the first display region AA1 is the farthest region from the bending area BB, the first traces L1 cross the entire display area AA.

Referring to FIG. 19 again, FIG. 19 shows an example in which second-type connecting holes Kb are located in the second display region AA2. Since the second display region AA2 is located middle of the display area AA of the substrate 100, the first traces L1 cross the second display region AA2 and the third display region AA3.

It will be noted that in this case, the BB rectangle in the display area AA in FIG. 16 and FIG. 18 is only for illustrating that the first traces L1 are arranged therein for connecting the second traces L2. Only the bending area BB at a position outside a lower edge of the display area AA and proximate to the bonding area ZZ is an effective bending area for bending to a back surface of the substrate 100. A specific structure may be combined with FIG. 17 and FIG. 19.

Referring to FIG. 17 and FIG. 20 again, in a case where connecting holes K are located in the first display region AA1, the second traces L2 are located in the display area AA, and the first traces L1 are located in the bending area BB and extend to the display area AA, to realize the electrical connection of the second traces L2 with the first traces L1 through the connecting holes K, the first traces L1 need to extend to the first display region AA1. That is, the first traces L1 cross the second display region AA2 and the third display region AA3 in this case. And since the first traces L1 are located between the first base 10 and the first organic layer 20. In this case, the first traces L1 may provide light-shielding for channel portions of some transistors TFT located in the display area AA, thereby simplifying the process of the substrate 100.

Similarly, referring to FIG. 19 and FIG. 20, the first traces L1 may provide light-shielding for channel portions of some transistors TFT located in the display area AA, thereby simplifying the process of the substrate 100. The first traces L1 may also be prevented from being too long, and the stability of signals transmitted on the first traces L1 is improved.

Referring to FIG. 3 and FIG. 21, FIG. 3 shows an example in which the second-type connecting holes Kb are located in the third display region AA3. The third display region AA3 is closest to the bending area BB, so as to well prevent the impedance of the first traces L1 from affecting the second traces L2. In this case, the light-shielding pattern LS and the first traces L1 are arranged in a same layer, and the light-shielding pattern LS and the first traces L1 may have a layer structure formed by a single patterning process using a same mask, which is beneficial to simplifying the manufacturing process of the substrate 100.

It will be understood that, no matter the second-type connecting hole Kb is located in the first display region AA1, the second display region AA2 or the third display region AA3, the proportion of a region occupied by the first traces L1 in the lower bezel of the substrate 100 may be reduced to a certain extent, so as to be beneficial to realizing a narrow frame of the substrate 100.

In some examples, connecting holes K may be located in non-display areas, such as the top and left and right sides of the first display region AA1, the left and right sides of the second display region AA2 and the third display region AA3, and the like, which including a gate driving circuit area, a peripheral area, and an area outside a blocking dam, which is not limited in the embodiments of the present disclosure.

In some embodiments, referring to FIG. 3, the substrate 100 further includes: a display area AA, a bending area BB and a second fan-out area F2. The bending area BB is located between the display area AA and the second fan-out area F2. The substrate 100 further includes third trace(s) L3. The third trace L3 is located in the second fan-out area F2. The first trace L1 is located in the bending area BB, and the other end of the first trace L1 extends to the second fan-out area F2. At least one connecting hole K is a third-type connecting hole Kc, and the third-type connecting hole Kc is located in the second fan-out area. The portion L1B of the first trace L1 located in the second fan-out area F2 and the third trace L3 are electrically connected through the third-type connecting hole Kc.

The second trace L2 is electrically connected to the first trace L1 through the second-type connecting hole Kb. The first trace L1 extends to the second fan-out area F2, the portion L1B of the first trace L1 located in the second fan-out area F2 is electrically connected to a driving chip through the third-type connecting hole Kc and the third trace L3. The second trace L2 is electrically connected to the first trace L1 through the second-type connecting hole Kb located in the display area AA, so as to realize the fan-out trace convergence effect. Compared to a manner in which fan-out traces are converged at the lower edge of the display area AA, the above structure can reduce an area of a portion of the lower frame occupied by the fan-out traces, thus facilitating the reduction of the lower frame of the substrate 100 to achieve a narrow frame of the substrate 100.

In some embodiments, referring to FIG. 20 and FIG. 21, the substrate 100 further includes a first planarization 34, a second source-drain metal layer SD2, a second planarization 35, an anode layer 50, a pixel defining layer 36 and spacers 60.

In these embodiments, a transistor TFT is electrically connected to an effective light-emitting portion through the anode layer 50, so that the effective light-emitting portion performs independent light emission. The anode layer 50 is made of a metal material such as copper or silver.

In addition, the spacers 60 are arranged on a side of the pixel defining layer 36 away from the first base 10, and can support a fine metal mask (FMM for short), prevent the substrate 100 from being scratched by the fine metal mask in a subsequent evaporation process, and improve a yield of the substrate 100.

Figure 22:
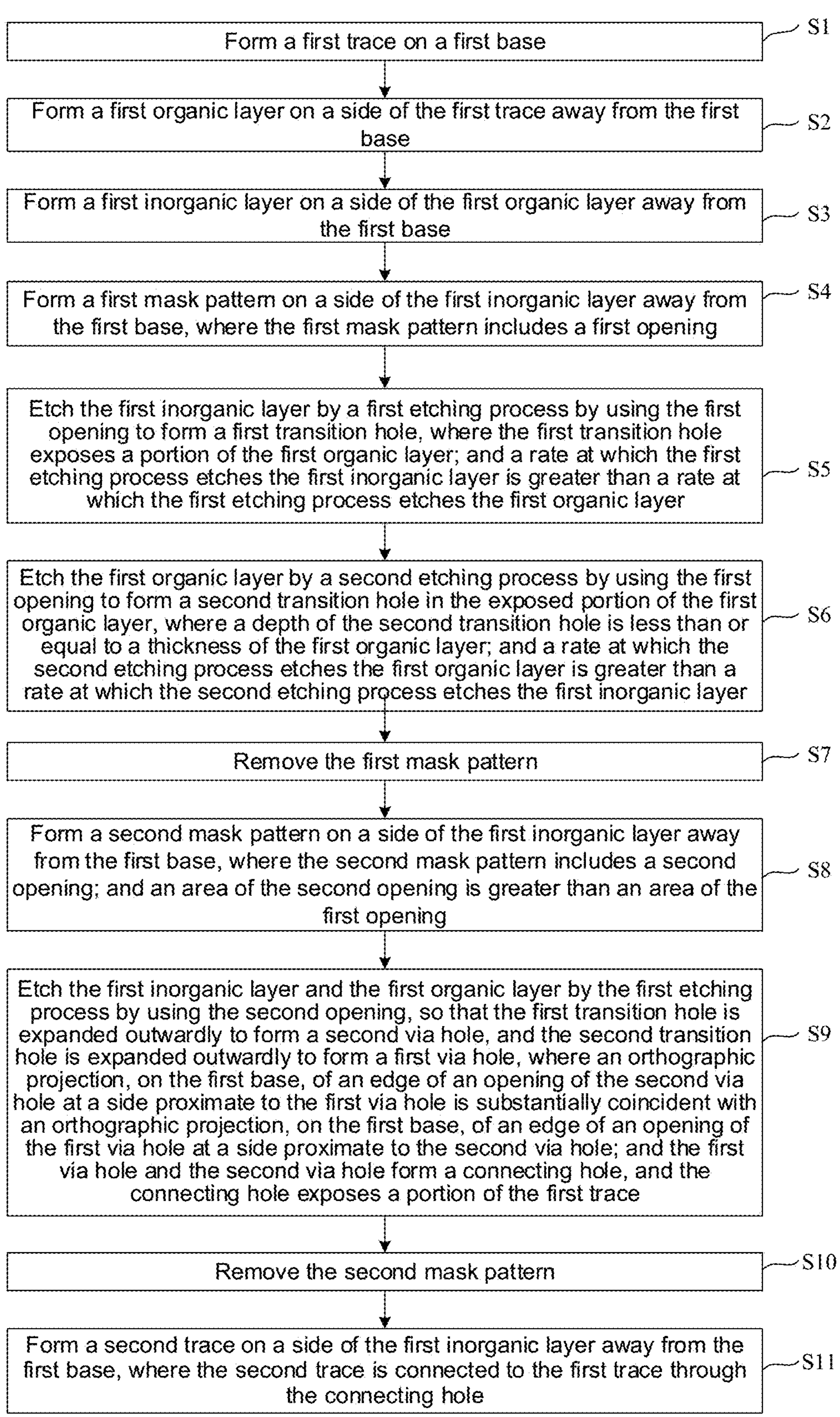
FIG. 22 is a flowchart of a manufacturing method of a substrate provided in some embodiments of the present disclosure.
Figure 23:
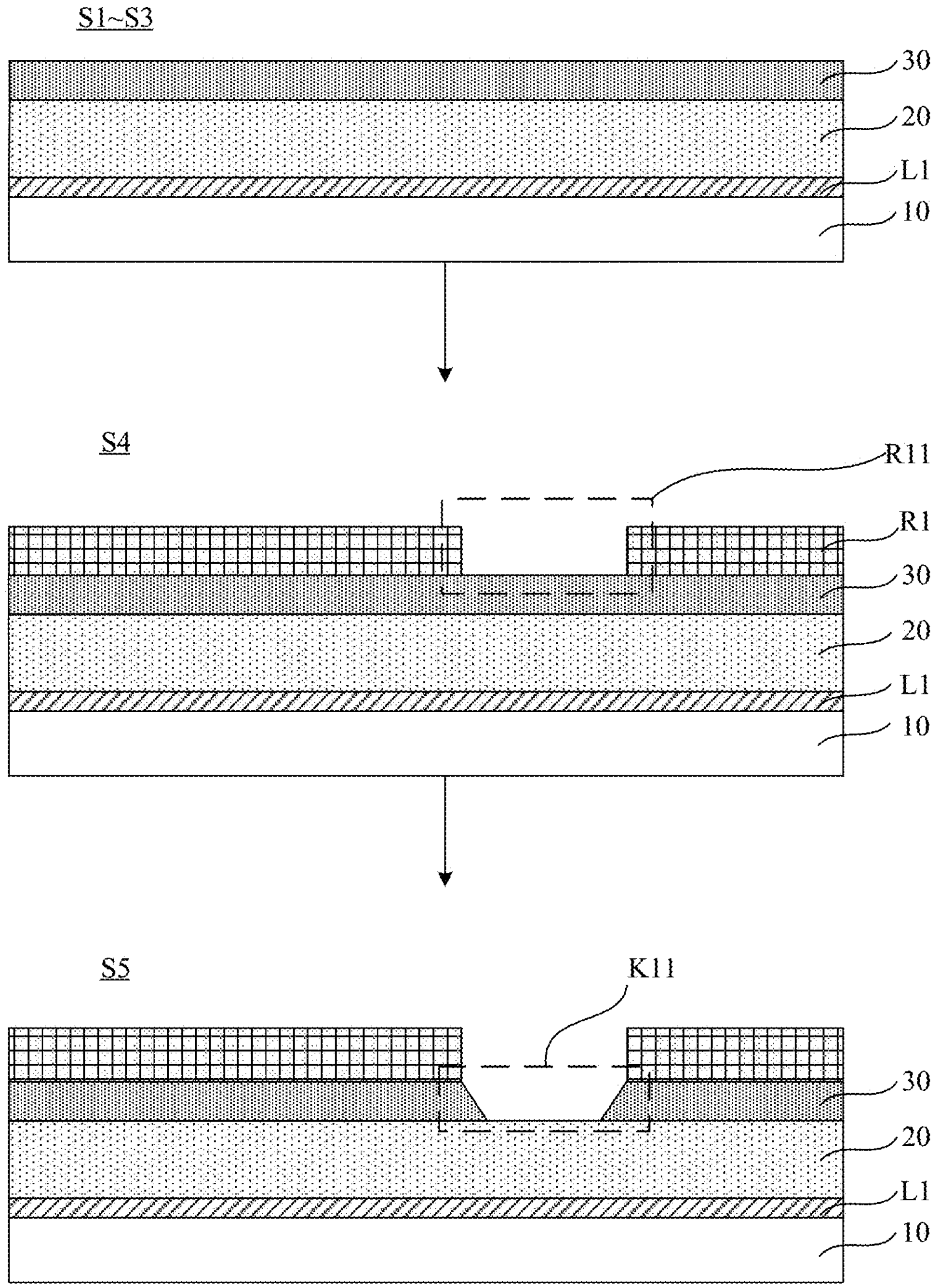
FIG. 23 is a structural diagram corresponding to some steps in FIG. 22.
Figure 24:
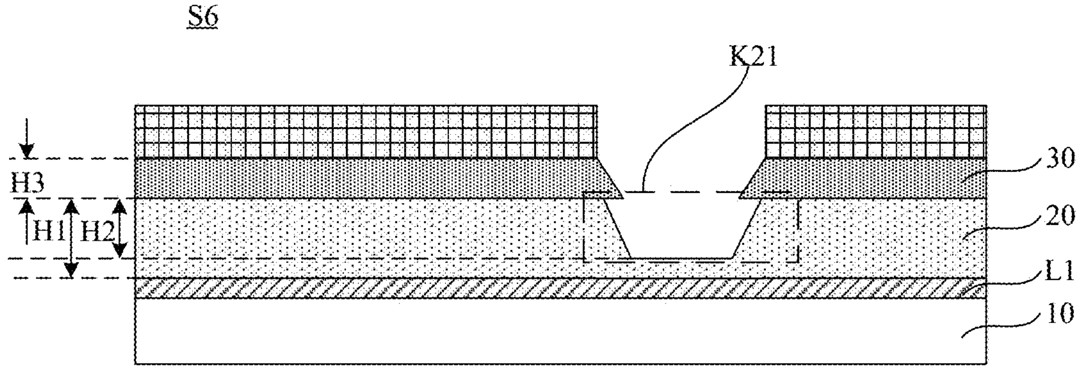
FIG. 24 is a structural diagram corresponding to some other steps in FIG. 22.
Figure 25:
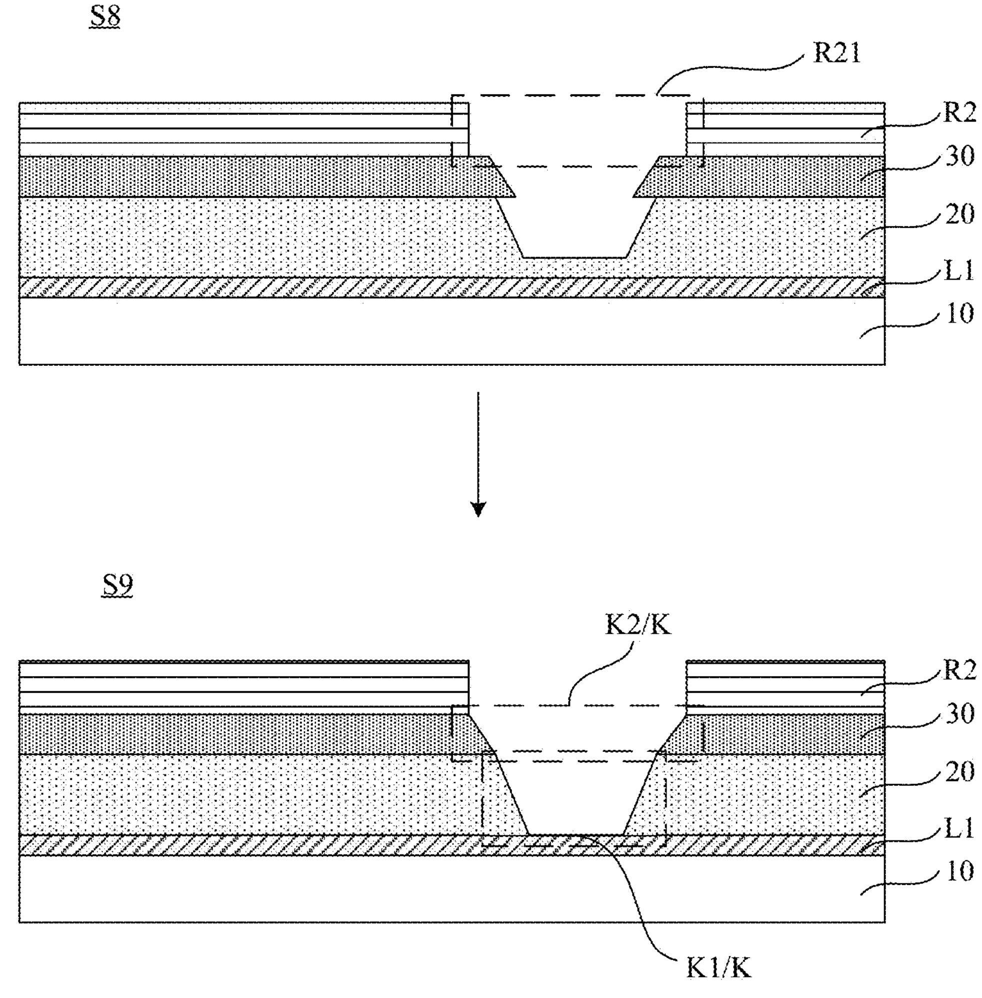
FIG. 25 is a structural diagram corresponding to yet some other steps in FIG. 22.
Figure 26:
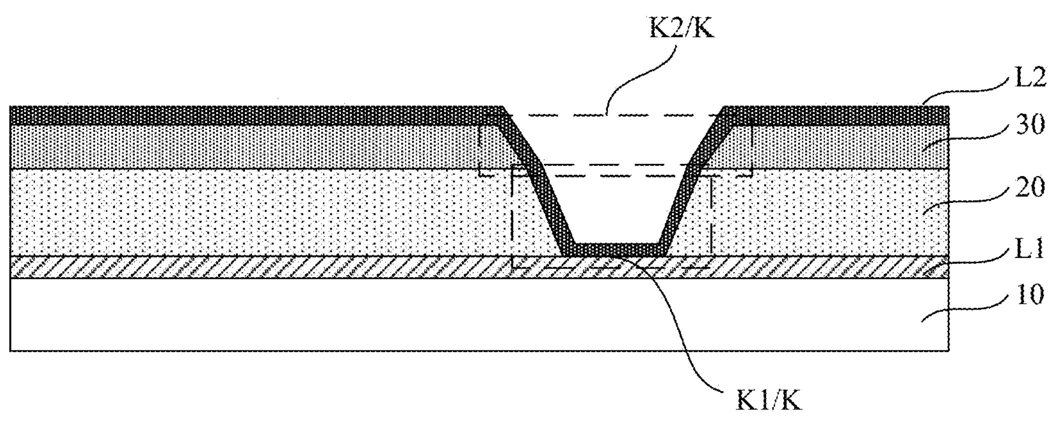
FIG. 26 is a structural diagram corresponding to yet some other steps in FIG. 22.

FIG. 22 is a flowchart of a manufacturing method of a substrate provided in some embodiments of the present disclosure. FIG. 23 is a structural diagram corresponding to some steps in FIG. 22. FIG. 24 is a structural diagram corresponding to some other steps in FIG. 22. FIG. 25 is a structural diagram corresponding to yet some other steps in FIG. 22. FIG. 26 is a structural diagram corresponding to yet some other steps in FIG. 22. Referring to FIG. 22 to FIG. 26, some embodiments of the present disclosure provide a manufacturing method of a substrate 10, which includes the following steps.

In step S1, first trace(s) L1 is formed on a first base.

In this step, referring to S1 to S3 in FIG. 23, the first trace L1 can be formed on the first base 10. For example, a first trace layer is deposited on the first base 10 by sputtering, and the first trace layer is patterned by photolithography to form at least one first trace L1.

Before step S1, the first base is formed. In some examples, the first base may be a flexible base. For example, a material of the first base may be an organic material. For example, the material of the first base may be any one of polyimide (PI), polycarbonate (PC) and polyvinyl chloride (PVC).

In some examples, a thickness of the first base 10 may be in a range of 5 μm to 20 μm, inclusive. That is, the thickness of the first base 10 is set in the range of 5 μm to 20 μm, inclusive. In a case where the thickness of the first base 10 is equal to or approaches 5 μm, the first base 10 having a small thickness may facilitate the substrate 100 to have a light weight and small thickness. In a case where the thickness of the first base 10 is equal to or approaches 20 μm, the first base 10 having a large thickness may provide a good support effect for supporting other film layers arranged on the first base 10 in a stack.

In some examples, the thickness of the first base 10 may be in a range of 10 μm to 20 μm, inclusive. That is, the thickness of the first base 10 is set in the range of 10 μm to 20 μm, inclusive, so that the first base 10 having a large thickness may provide a good support effect.

In some examples, the thickness of the first base 10 may be in a range of 10 μm to 15 μm, inclusive. That is, the thickness of the first base 10 is set in the range of 10 μm to 15 μm, inclusive, so that the first substrate 10 may avoid an excessive thickness while provide a good support effect, thereby facilitating the substrate 100 to have a light weight and small thickness.

For example, the thickness of the first base 10 may be any one of 10 μm, 15 μm, and 20 μm.

In step S2, a first organic layer is formed on a side of the first trace away from the first base.

In this step, referring to S1 to S3 in FIG. 23, the first organic layer 20 is formed on the side of the first trace L1 away from the first base 10.

In some examples, the first organic layer 20 may be a flexible base. For example, a material of the first organic layer 20 may be polyimide (PI). Materials of the first organic layer 20 and the first base 10 are same. It can be understood that in some other embodiments, the material of the first organic layer 20 may be different from the material of the first base 10.

In some examples, a thickness of the first organic layer 20 may be in a range of 1 μm to 10 μm, inclusive. That is, the thickness of the first organic layer 20 is set in the range of 1 μm to 10 μm, inclusive. In a case where the thickness of the first organic layer 20 is equal to or approaches 1 μm, the first organic layer 20 having a small thickness may facilitate the substrate 100 to have a light weight and a small thickness, and facilitate forming a first via hole K1 in the first organic layer 20 to extend through the first organic layer 20, which helps reduce the process difficulty of the substrate 100. In a case where the thickness of the first organic layer 20 is equal to or approaches 10 μm, the first organic layer 20 having a large thickness as a second base may provide a good support effect for supporting film layers arranged on a side of the first organic layer 20 away from the first base 10 in a stack.

In some examples, the thickness of the first organic layer 20 may be in a range of 4 μm to 10 μm, inclusive. That is, the thickness of the first organic layer 20 is set in the range of 4 μm to 10 μm, inclusive. The first organic layer 20 having a large thickness as the second base may provide a good support effect for supporting film layers arranged on a side of the first organic layer 20 away from the first base 10.

In some examples, the thickness of the first organic layer 20 may be in a range of 4 μm to 8 μm, inclusive. That is, the thickness of the first organic layer 20 is set in the range of 4 μm to 8 μm, inclusive. The thickness of first organic layer 20 can meet the requirements of the role of the first organic layer 20 in providing support and facilitate forming the first via hole K1 in the first organic layer 20 to extend through the first organic layer 20, which helps reduce the process difficulty of the substrate 100.

For example, the thickness of the first organic layer 20 may be any one of 5 μm, 6 μm, and 7 μm.

In some examples, the thickness of the first organic layer 20 may be less than or equal to the thickness of the first base 10. Since the first base 10 does not need to be provided with a via hole or the like, the thickness of the first base 10 may be set to be relatively large, so as to ensure the supporting function of the first base 10 in the substrate 100. The thickness of the first organic layer 20 located above the first base 10 may be set to be relatively small, which facilitates the via design and can also play a supporting role to a certain extent. For example, the thickness of the first organic layer 20 may be equal to or less than half the thickness of the first base 10. For example, the thickness of the first organic layer 20 is 5 μm, and the thickness of the first base 10 is 15 μm.

In step S3, a first inorganic layer formed on a side of the first organic layer away from the first base.

In this step, referring to S1 to S3 in FIG. 23, the first inorganic layer 30 is formed on the side of the first organic layer 20 away from the first base 10. For example, the first inorganic layer 30 may include a plurality of stacked inorganic film layers.

In step S4, a first mask pattern is formed on a side of the first inorganic layer away from the first base, and the first mask pattern includes a first opening.

In this step, referring to S4 in FIG. 23, the first mask pattern R1 is formed on a side of the first inorganic layer 30 away from the first base 10, and the first mask pattern R1 includes a first opening R11.

In step S5, the first inorganic layer is etched by a first etching process by using the first opening to form a first transition hole, and the first transition hole exposes a portion of the first organic layer; and a rate at which the first etching process etches the first inorganic layer is greater than a rate at which the first etching process etches the first organic layer.

In this step, referring to S5 in FIG. 23, the first inorganic layer 30 is etched by the first etching process by using the first opening R11 to form the first transition hole K11, and the first transition hole K11 exposes a portion of the first organic layer 20; and the rate at which the first etching process etches the first inorganic layer 30 is greater than the rate at which the first etching process etches the first organic layer 20.

In step S6, the first organic layer is etched by a second etching process by using the first opening to form a second transition hole in the exposed portion of the first organic layer, and a depth of the second transition hole is less than or equal to a thickness of the first organic layer; and a rate at which the second etching process etches the first organic layer is greater than a rate at which the second etching process etches the first inorganic layer.

In this step, referring to S6 in FIG. 24, the first organic layer 20 is etched by the second etching process by using the first opening R11 to form the second transition hole K21 in the exposed portion of the first organic layer, and the depth of the second transition hole K21 is less than or equal to the thickness of the first organic layer 20; and the rate at which the second etching process etches the first organic layer 20 is greater than the rate at which the second etching process etches the first inorganic layer 30.

Since the first etching process and the second etching process each have different etching rates for the first organic layer 20 and the first inorganic layer 30, a rate of lateral etching of the first organic layer 20 is greater than a rate of lateral etching of the first inorganic layer 30. As a result, referring to S6 in FIG. 24, an orthographic projection, on the first base 10, of an edge of an opening of the first transition hole K11 at a side proximate to the second transition hole K21 falls into an orthographic projection, on the first base 10, of an edge of an opening of the second transition hole K21 at a side proximate to the first transition hole K11, thereby forming an undercut structure. If a second trace L2 is formed directly after the above steps, the second trace L2 may be broken at a position of the undercut structure, which may affect the quality of the substrate 100. In light of this, the manufacturing method of the substrate provided by the present disclosure further includes the following steps, as in step S9, for improving the undercut structure in the connecting hole K.

FIG. 24 shows an example in which the second transition hole K21 does not extend through the first organic layer 20 in S6. It can be understood that in some other embodiments, the second transition hole K21 may extend through the first organic layer 20 to expose a portion of the first trace L1. The second transition hole K21 is a slot as shown in S6 in FIG. 24. In this case, since the formed second transition hole K21 does not extend through the first organic layer 20 when the first organic layer 20 is etched by the second etching process, an outward expansion of the opening of the second transition hole K21 at the side proximate to the first transition hole K11 can be reduced, and the extent of undercut can be reduced, thereby reducing the risk of breakage of the first trace L1 in the substrate 100 and improving the yield of the substrate 100.

In step S7, the first mask pattern is removed. The first mask pattern R1 is removed in this step, which is not shown in FIG. 23 to FIG. 26.

In step S8, a second mask pattern is formed on a side of the first inorganic layer away from the first base, and the second mask pattern includes a second opening; and an area of the second opening is greater than an area of the first opening.

In this step, referring to S8 in FIG. 25, the second mask pattern R2 is formed on the side of the first inorganic layer 30 away from the first base 10, and the second mask pattern R2 includes a second opening R21; and the area of the second opening R21 is greater than the area of the first opening R11.

In step S9, the first inorganic layer and the first organic layer are etched by the first etching process by using the second opening, so that the first transition hole is expanded outwardly to form a second via hole, and the second transition hole is expanded outwardly to form a first via hole, an orthographic projection, on the first base, of an edge of an opening of the second via hole at a side proximate to the first via hole is substantially coincident with an orthographic projection, on the first base, of an edge of an opening of the first via hole at a side proximate to the second via hole; and the first via hole and the second via hole form a connecting hole, and the connecting hole exposes a portion of the first trace.

In this step, referring to S9 in FIG. 25, the first inorganic layer 30 and the first organic layer 20 are etched by the first etching process by using the second opening R21, so that the first transition hole K11 is expanded outwardly to form the second via hole K2, and the second transition hole K21 is expanded outwardly to form the first via hole K1, the orthographic projection, on the first base 10, of the edge of the opening of the second via hole K2 at the side proximate to the first via hole K1 is substantially coincident with the orthographic projection, on the first base 10, of the edge of the opening of the first via hole K1 at the side proximate to the second via hole K2; and the first via hole K1 and the second via hole K2 form the connecting hole K, and the connecting hole K exposes a portion of the first trace L1.

By setting the area of the second opening R21 to be greater than the area of the first opening R11, the undercut structure in the first inorganic layer 30 may be etched by using the second opening R21, so that the orthographic projection, on the first base 10, of the edge of the opening of the second via hole K2 at the side proximate to the first via hole K1 is substantially coincident with the orthographic projection, on the first base 10, of the edge of the opening of the first via hole K1 at the side proximate to the second via hole K2, that is, a side wall of the first via hole K1 and a side wall of the second via hole K2 are in smooth transition at an intersection position therebetween. Since the rate at which the first etching process etches the first inorganic layer 30 is greater than the rate at which the first etching process etches the first organic layer 20, the undercut structure is prevented from being formed again when the first inorganic layer 30 is etched for a second time.

Also, since the first inorganic layer 30 and the first organic layer 20 are both etched for the second time in step S9, the undercut problem caused by the difference between the lateral etching rate for the first inorganic layer 30 and the lateral etching rate for the first organic layer 20 may be solved. Therefore, the thickness of the first organic layer 20 does not need to be specially limited, that is, the thickness of the first organic layer 20 can be flexibly set, and the thickness of the first organic layer 20 may be set to be in a range of 4 μm to 10 μm, inclusive, thereby reducing the difficulty of the process for forming the first organic layer 20.

In step S10, the second mask pattern is removed. In this step, the second mask pattern R2 may be removed, which is not shown in FIG. 23 to FIG. 26.

In step S11, a second trace is formed on a side of the first inorganic layer away from the first base, and the second trace is connected to the first trace through the connecting hole.

In this step, referring to S11 in FIG. 26, the second trace L2 is formed on the side of the first inorganic layer 30 away from the first base 10, and the second trace L2 is connected to the first trace L1 through the connecting hole K.

Since the orthographic projection, on the first base 10, of the edge of the opening of the second via hole K2 at the side proximate to the first via hole K1 is substantially coincident with the orthographic projection, on the first base 10, of the edge of the opening of the first via hole K1 at the side proximate to the second via hole K2, a side wall of the first via hole K1 and a side wall of the second via hole K2 are in smooth transition at an intersection position therebetween. As a result, the problem of breakage caused by the undercut structure existing at the intersection position between the side wall of the first via hole K1 and the side wall of the second via hole K2 when the second trace L2 is formed may be prevented, thereby reducing the risk of breakage of the traces in the substrate 100 and improving the yield of the substrate 100.

To sum up, in the manufacturing method of the substrate provided by the embodiments of the present disclosure, in steps S5 and S6, the first inorganic layer 30 is etched by the first etching process by using the first opening R11 to form the first transition hole K11, and the first transition hole K11 exposes the portion of the first organic layer 20;

and the first organic layer 20 is etched by the second etching process by using the first opening R11 to form the second transition hole K21, and the second transition hole K21 may extend through the first organic layer 20 or may not extend through the first organic layer 20. In a case where the second transition hole K21 does not extend through the first organic layer 20, the extent of lateral etching of the second transition hole K21 may be reduced, compared to a case where the second transition hole K21 directly extends through the first organic layer 20, so that the extent of invagination of the undercut structure may be reduced to some extent. Based on this, in step S9, the first inorganic layer 30 and the first organic layer 20 are etched by the first etching process by using the second opening R21, so that the first transition hole K11 is expanded outwardly to form the second via hole K2, and the second transition hole K21 is expanded outwardly to form the first via hole K1. In this way, the first via hole K1 exposes a portion of the first trace L1. Moreover, when the first transition hole K11 is expanded outwardly to form the second via hole K2, in the first inorganic layer 30, the undercut structure formed in the first via hole K1 is etched, so that the orthographic projection, on the first base 10, of the edge of the opening of the second via hole K2 at the side proximate to the first via hole K1 is substantially coincident with the orthographic projection, on the first base 10, of the edge of the opening of the first via hole K1 at the side proximate to the second via hole K2, the side wall of the first via hole K1 and the side wall of the second via hole K2 are in smooth transition at the intersection position therebetween, the second trace L2 is prevented from being broken, and the yield of the substrate 100 is improved.

In some examples, before forming the first trace on the first base in step S1, the method further includes the following step: forming a first barrier layer on the first base. Forming the first trace on the first base includes forming the first trace on a side of the first barrier layer away from the first base. A material of the first barrier layer includes silicon oxide (SiOx) and silicon nitride (SiNx).

In some embodiments, referring to FIG. 24 again, the result of H1 minus H2 is less than or equal to H3 ($H1-H2 \leq H3$), where H1 is the thickness of the first organic layer 20, H2 is the depth of the second transition hole K21, and H3 is the thickness of the first inorganic layer 30.

In S6, the first organic layer is etched through the second etching process to form the second transition hole K21, and the second transition hole K21 does not extend through the first organic layer 20, therefore, in step S9, when the first inorganic layer 30 is etched for the second time, the second transition hole K21 needs to be etched again to extend through the first organic layer 20 to expose the portion of the first trace L1. Also, since the first etching process etches the first inorganic layer 30 at a rate greater than that of the first etching process etching the first organic layer 20, a thickness ($H1-H2$) of the remaining portion of the first organic layer 20 is needed to be less than or equal to the thickness H3 of the first inorganic layer 30. In this way, a period for outwardly expanding the second transition hole K21 by using the first etching process is shorter than a period for outwardly expanding the first transition hole K11, so that it can be avoided that the wiring layout of the substrate 100 is affected by the fact that the first transition hole K11 in the etched first inorganic layer 30 is too large due to the fact that the first organic layer 20 needs to be etched for a long time. In addition, since the first trace L1 is located between the first organic layer 20 and the first base 10, and the first trace L1 is made of a metal material, so that the first trace L1 may be used as a barrier layer for the first organic layer 20. In a case where the thickness ($H1-H2$) of the remaining portion of the first organic layer 20 is small, that is, the second transition hole K21 is etched to extend through the first organic layer 20, the first trace L1 can prevent the etching from continuing, and the first base 10 will not be affected. Thus, the etching of the first inorganic layer 30 may be continued until the orthographic projection, on the first base 10, of the edge of the opening of the second via hole K2 at the side proximate to the first via hole K1 is substantially coincident with the orthographic projection, on the first base 10, of the edge of the opening of the first via hole K1 at the side proximate to the second via hole K2.

In some examples, the thickness ($H1-H2$) of the remaining portion of the first organic layer 20 and the thickness H3 of the first inorganic layer 30 are set to be approximately equal.

In these examples, the second transition hole K21 is formed by etching the first organic layer through the second etching process, and the second transition hole K21 does not extend through the first organic layer 20. In step S9, when the first inorganic layer 30 is etched for the second time, the second transition hole K21 needs to be etched again to extend through the first organic layer 20 to expose the portion of the first trace L1. The thickness ($H1-H2$) of the remaining portion of the first organic layer 20 and the thickness H3 of the first inorganic layer 30 are set to be approximately equal. In this way, the problem that due to the fact that the thickness of the first organic layer 20 is small, when the second transition hole K21 in the first organic layer 20 is already expanded outwardly to form the first via hole K1 and the first via hole K1 exposes the portion of the first trace L1, the first transition hole K11 in the first inorganic layer 30 is not yet expanded outwardly to form the second via hole K2 which can solve the undercut problem, and etching needs to be continued, which may cause undercut again when the second via hole K2 is continuously etched can be prevented. Thus, by setting the thickness (H1−H2) of the remaining portion of the first organic layer 20 and the thickness H3 of the first inorganic layer 30 are set to be approximately equal, it is possible to prevent the problem that the undercut is formed again by the outward expansion of the first via hole K1 while ensuring that the undercut problem is solved by the second via hole K2.

In addition, it will be noted that since there is a certain uncontrollable error (such as a manufacturing process error, an equipment accuracy, and a measurement error), in a case where a floating range of a difference between the thickness (H1−H2) of the remaining portion of the first organic layer 20 and the thickness H3 of the first inorganic layer 30 is not more than 30% of the thickness H3 of the first inorganic layer 30, that is, not more than 30%×H3, it can be considered that the thickness (H1−H2) of the remaining portion of the first organic layer 20 and the thickness H3 of the first inorganic layer 30 satisfy a limitation condition of being approximately equal.

In some examples, in a case where the floating range of the difference between the thickness (H1−H2) of the remaining portion of the first organic layer 20 and the thickness H3 of the first inorganic layer 30 is not more than 20% of the thickness H3 of the first inorganic layer 30, that is, the difference fluctuates within a range of +20%×H3, it can be considered that the thickness (H1−H2) of the remaining portion of the first organic layer 20 and the thickness H3 of the first inorganic layer 30 satisfy the limitation condition of being approximately equal.

In some examples, in a case where the floating range of the difference between the thickness (H1−H2) of the remaining portion of the first organic layer 20 and the thickness H3 of the first inorganic layer 30 is not more than 10% of the thickness H3 of the first inorganic layer 30, that is, the difference fluctuates within a range of +10%×H3, it can be considered that the thickness (H1−H2) of the remaining portion of the first organic layer 20 and the thickness H3 of the first inorganic layer 30 satisfy the limitation condition of being approximately equal.

In some examples, in a case where the floating range of the difference between the thickness (H1−H2) of the remaining portion of the first organic layer 20 and the thickness H3 of the first inorganic layer 30 is not more than 5% of the thickness H3 of the first inorganic layer 30, that is, the difference fluctuates within a range of +5%×H3, it can be considered that the thickness (H1−H2) of the remaining portion of the first organic layer 20 and the thickness H3 of the first inorganic layer 30 satisfy the limitation condition of being approximately equal.

For example, in a case where the floating range of the difference between the thickness (H1−H2) of the remaining portion of the first organic layer 20 and the thickness H3 of the first inorganic layer 30 is not more than 0.1 μm, it can be considered that the thickness (H1−H2) of the remaining portion of the first organic layer 20 and the thickness H3 of the first inorganic layer 30 satisfy the limitation condition of being approximately equal.

In some examples, in step S5, etching the first inorganic layer 30 by the first etching process by using the first opening R11 includes: introducing a first gas into the first opening R11 to etch the first inorganic layer 30. In step S9, etching the first inorganic layer 30 and the first organic layer 20 by the first etching process by using the second opening R21 includes: introducing the first gas into the second opening R21 to etch the first inorganic layer 30 and the first organic layer 20. An etching rate of the first gas on the first inorganic layer 30 is greater than an etching rate of the first gas on the first organic layer 20.

In step S9, the first inorganic layer 30 and the first organic layer 20 are etched by the first etching process by using the second opening R21. In an aspect, the first gas etches the first inorganic layer 30 at a rate greater than that of the first gas etching the first organic layer 20, the extent of the lateral etching in this step is small to avoid the formation of the undercut structure again. In another aspect, since the gas diffusion extent is lower closer to the first trace L1, the etching rate for the first organic layer 20 is lower, which is also beneficial to reducing the lateral etching and avoiding forming the undercut structure again.

For example, the first gas includes carbon tetrafluoride and sulfur hexafluoride. The present disclosure does not limit the material in the first gas, as long as the etching rate of the first gas to the first inorganic layer 30 may be greater than the etching rate of the first gas to the first organic layer 20.

In some examples, in step S6, etching the first organic layer 20 by the second etching process by using the first opening R11 includes: introducing a second gas into the first opening R11 to etch the first organic layer 20. An etching rate of the second gas on the first organic layer 20 is greater than an etching rate of the second gas on the first inorganic layer 30.

In this step, when the second transition hole K21 is formed by etching the first organic layer 20 with the second gas, the etching rate of the second gas to the first organic layer 20 is greater than that of the second gas to the first inorganic layer 30. The second gas hardly has an etching effect on the first inorganic layer 30, so that the first inorganic layer 30 may be used as a mask of the first organic layer 30 for etching, a nested structure of the first transition hole K11 and the second transition hole K22 is ensured, and the formation of the connecting hole K by the first via hole K1 and the second via hole K2 is facilitated.

For example, the second gas includes carbon tetrafluoride and oxygen. The present disclosure does not limit the material in the second gas, as long as the etching rate of the second gas to the first organic layer 20 may be greater than the etching rate of the second gas to the first inorganic layer 30.

In some embodiments, referring to FIG. 23 and FIG. 25, a distance between an edge of an orthographic projection of the first opening R11 on the first base 10 and an orthographic projection of an edge of the second opening R21 on the first base 10 is in a range of 0.5 μm to 1 μm, inclusive.

Since the first etching process and the second etching process each have different etching rates for the first organic layer 20 and the first inorganic layer 30, the orthographic projection, on the first base 10, of the edge of the opening of the first transition hole K11 in the first inorganic layer 30 at the side proximate to the second transition hole K21 falls into the orthographic projection, on the first base 10, of the edge of the opening of the second transition hole K21 in the first organic layer 20 at the side proximate to the first transition hole K11, thereby forming the undercut structure. A width of the undercut structure is approximately within 0.5 μm. By setting the distance between the edge of the orthographic projection of the first opening R11 on the first base 10 and the orthographic projection of the edge of the second opening R21 on the first base 10 to be equal to or approaches 0.5 μm, the problem of the undercut structure can be improved, and the maximum radial dimension of the connecting hole K can be further reduced, which facilitates the wiring layout of the substrate 100. By setting the distance between the edge of the orthographic projection of the first opening R11 on the first base 10 and the orthographic projection of the edge of the second opening R21 on the first base 10 is equal to or approaches 1 μm, the maximum radial dimension of the connecting hole K can be prevented from being too large, which is beneficial to the wiring layout of the substrate 100, and the problem of the undercut structure may be improved well, and the risk of breakage of the second trace L2 is reduced.

In some examples, the distance between the edge of the orthographic projection of the first opening R11 on the first base 10 and the orthographic projection of the edge of the second opening R21 on the first base 10 is in a range of 0.6 μm to 0.9 μm, inclusive.

In these examples, by setting the distance between the edge of the orthographic projection of the first opening R11 on the first base 10 and the orthographic projection of the edge of the second opening R21 on the first base 10 is in the range of 0.6 μm to 0.9 μm, inclusive, the undercut portion formed in the first inorganic layer 30 can be etched when the second via hole K2 is formed by outwardly expanding the first transition hole K11, and the undercut problem of the connecting hole K is effectively solved.

In some examples, the distance between the edge of the orthographic projection of the first opening R11 on the first base 10 and the orthographic projection of the edge of the second opening R21 on the first base 10 is in a range of 0.7 μm to 0.8 μm, inclusive.

In these examples, by setting the distance between the edge of the orthographic projection of the first opening R11 on the first base 10 and the orthographic projection of the edge of the second opening R21 on the first base 10 is in the range of 0.7 μm to 0.8 μm, inclusive, the undercut portion formed in the first inorganic layer 30 can be etched when the second via hole K2 is formed by outwardly expanding the first transition hole K11, and the maximum radial dimension of the formed second via hole K2 can be prevented from being too large, which avoids affecting the wiring layout of the substrate 100.

Figure 27:
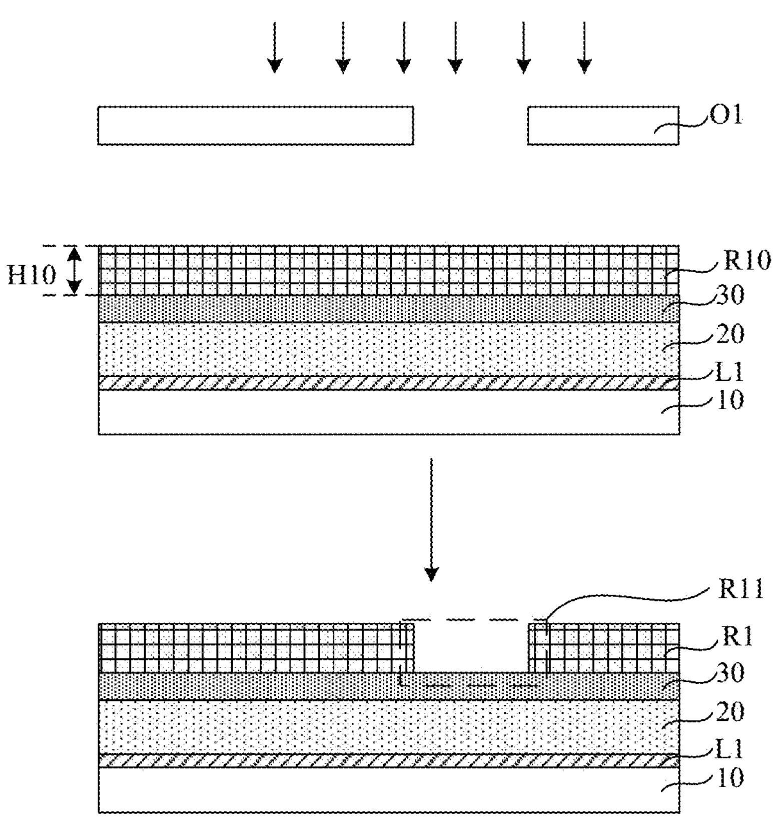
FIG. 27 is a structural diagram corresponding to step S4 in FIG. 22.
Figure 28:
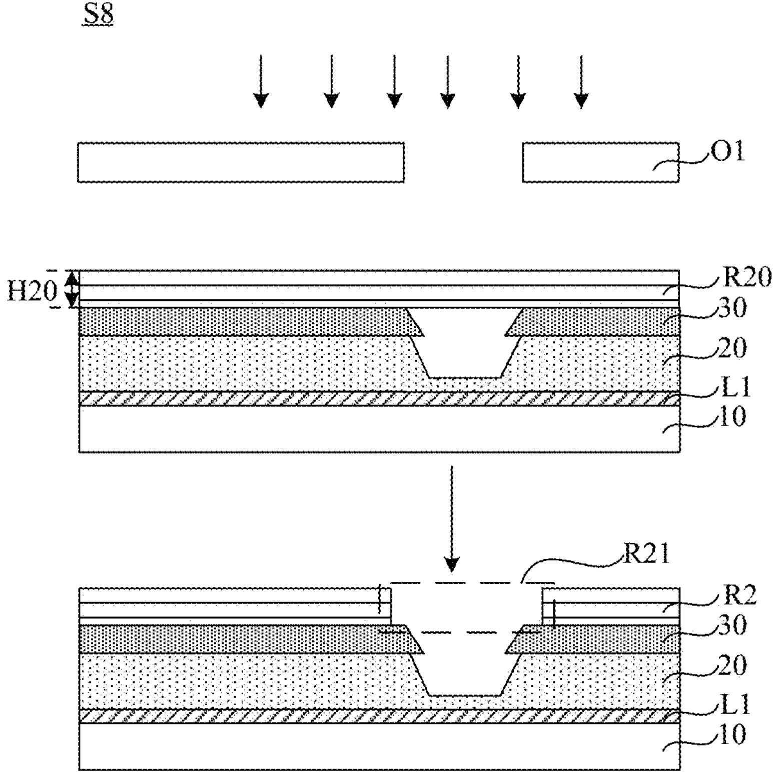
FIG. 28 is a structural diagram corresponding to step S8 in FIG. 22.

FIG. 27 is a structural diagram corresponding to step S4 in FIG. 22. FIG. 28 is a structural diagram corresponding to step S8 in FIG. 22. FIG. 27 and FIG. 28 show only a process of step S4 and a process of step S8 in FIG. 22, respectively, and the forming processes for other steps can be combined with those shown in FIG. 13 to FIG. 16. In some embodiments, referring to FIG. 27, forming the first mask pattern R1 includes: forming a first organic light-sensitive material layer R10 on the side of the first inorganic layer 30 away from the first base 10; and exposing and developing the first organic light-sensitive material layer R1 by using a first mask plate O1 to form the first mask pattern R1 with the first opening R11.

Referring to FIG. 28, in step S8, forming the first mask pattern R2 includes: forming a second organic light-sensitive material layer R20 on the side of the first inorganic layer 30 away from the first base 10; and exposing and developing the second organic light-sensitive material layer R20 by using the first mask plate O1 to form the second mask pattern R2 with the second opening R21. A thickness of the first organic light-sensitive material layer R10 is greater than a thickness of the second organic light-sensitive material layer R20, and/or an exposure amount to the first organic light-sensitive material layer R10 is less than an exposure amount to the second organic light-sensitive material layer R20.

It can be understood that for the thickness of the first organic light-sensitive material layer R10 being greater than the thickness of the second organic light-sensitive material layer R20, and/or the exposure amount to the first organic light-sensitive material layer R10 being less than the exposure amount to the second organic light-sensitive material layer R20, the following three cases are included.

In the first case, a thickness of the first organic light-sensitive material layer R10 is greater than a thickness of the second organic light-sensitive material layer R20. In this case, the exposure amount to the first organic light-sensitive material layer R10 is set to be equal to the exposure amount to the second organic light-sensitive material layer R20. By adjusting the thickness of the first organic light-sensitive material layer R10 and the thickness of the second organic light-sensitive material layer R20, i.e., setting the thickness of the first organic light-sensitive material layer R10 to be greater than the thickness of the second organic light-sensitive material layer R20, the area of the second opening R21 formed in the second mask pattern R2 can be greater than the area of the first opening R11 formed in the first mask pattern R1. In this way, the first inorganic layer 30 is etched for the second time by using the second mask pattern R2, thereby improving the problem of the undercut structure in the connecting hole K.

In the second case, the exposure amount to the first organic light-sensitive material layer R10 being less than the exposure amount to the second organic light-sensitive material layer R20. In this case, the thickness of the first organic light-sensitive material layer R10 is equal to the thickness of the second organic light-sensitive material layer R20. The first organic light-sensitive material layer R10 and the second organic light-sensitive material layer R20 are exposed and developed through the singe first mask plate O1. By adjusting the exposure amount to the first organic light-sensitive material layer R10 and the exposure amount to the second organic light-sensitive material layer R20, i.e., setting the exposure amount to the first organic light-sensitive material layer R10 to be less than the exposure amount to the second organic light-sensitive material layer R20, the area of the second opening R21 formed in the second mask pattern R2 can be greater than the area of the first opening R11 formed in the first mask pattern R1. In this way, the first inorganic layer 30 is etched for the second time by using the second mask pattern R2, thereby improving the problem of the undercut structure in the connecting hole K.

In the third case, the thickness of the first organic light-sensitive material layer R10 is greater than the thickness of the second organic light-sensitive material layer R20, and the exposure amount to the first organic light-sensitive material layer R10 is less than the exposure amount to the second organic light-sensitive material layer R20. The first organic light-sensitive material layer R10 and the second organic light-sensitive material layer R20 are exposed and developed through the singe first mask plate O1. By adjusting the thickness of the first organic light-sensitive material layer R10 and the thickness of the second organic light-sensitive material layer R20, and adjusting the exposure amount to the first organic light-sensitive material layer R10 and the exposure amount to the second organic light-sensitive material layer R20, i.e., setting the thickness of the first organic light-sensitive material layer R10 to be greater than the thickness of the second organic light-sensitive material layer R20, and setting the exposure amount to the first organic light-sensitive material layer R10 to be less than the exposure amount to the second organic light-sensitive material layer R20, the area of the second opening R21 formed in the second mask pattern R2 can be greater than the area of the first opening R11 formed in the first mask pattern R1.

In this way, the first inorganic layer 30 is etched for the second time by using the second mask pattern R2, thereby improving the problem of the undercut structure in the connecting hole K.

In any of the three cases described above, the area of the second opening R21 formed in the second mask pattern R2 can be made greater than the area of the first opening R11 formed in the first mask pattern R1. The present disclosure is not limited to a specific formation manner.

In some examples, referring to FIG. 27 and FIG. 28 again, the thickness H10 of the first organic light-sensitive material layer is approximately 3 μm, and the thickness H20 of the second organic light-sensitive material layer is approximately 2 μm.

On the basis of setting the thickness of the first organic light-sensitive material layer R10 to be greater than the thickness of the second organic light-sensitive material layer R20, the thickness H10 of the first organic light-sensitive material layer is defined to be approximately 3 μm, and the thickness H20 of the second organic light-sensitive material layer is defined to be approximately 2 μm, so that the area of the second opening R21 formed in the second mask pattern R2 can be greater than the area of the first opening R11 formed in the first mask pattern R1, thereby improving the problem of the undercut structure in the connecting hole K.

In addition, it will be noted that, since there is a certain uncontrollable error (such as a manufacturing process error, an equipment accuracy, and a measurement error), in a case where the error floating range of the thickness H10 of the first organic light-sensitive material layer R10 is within a range of 30%×3 μm, that is, the thickness H10 of the first organic light-sensitive material layer R10 fluctuates within a range of +0.9 μm, it can be considered that the thickness H10 of the first organic light-sensitive material layer R10 satisfies a limitation condition of being equal to 3 μm; and in a case where the error floating range of the thickness H20 of the second organic light-sensitive material layer R20 is within a range of 30%×2 μm, that is, the thickness H20 of the second organic light-sensitive material layer R20 fluctuates within a range of +0.6 μm, it can be considered that the thickness H20 of the second organic light-sensitive material layer R20 satisfies a limitation condition of being equal to 2 μm.

In some examples, in a case where the error floating range of the thickness H10 of the first organic light-sensitive material layer R10 is within a range of 20%×3 μm, that is, the thickness H10 of the first organic light-sensitive material layer R10 fluctuates within a range of +0.6 μm, it can be considered that the thickness H10 of the first organic light-sensitive material layer R10 satisfies the limitation condition of being equal to 3 μm; and in a case where the error floating range of the thickness H20 of the second organic light-sensitive material layer R20 is within a range of 20%×2 μm, that is, the thickness H20 of the second organic light-sensitive material layer R20 fluctuates within a range of +0.4 μm, it can be considered that the thickness H20 of the second organic light-sensitive material layer R20 satisfies the limitation condition of being equal to 2 μm.

In some examples, in a case where the error floating range of the thickness H10 of the first organic light-sensitive material layer R10 is within a range of 10%×3 μm, that is, the thickness H10 of the first organic light-sensitive material layer R10 fluctuates within a range of +0.3 μm, it can be considered that the thickness H10 of the first organic light-sensitive material layer R10 satisfies the limitation condition of being equal to 3 μm; and in a case where the error floating range of the thickness H20 of the second organic light-sensitive material layer R20 is within a range of 10%×2 μm, that is, the thickness H20 of the second organic light-sensitive material layer R20 fluctuates within a range of +0.2 μm, it can be considered that the thickness H20 of the second organic light-sensitive material layer R20 satisfies the limitation condition of being equal to 2 μm.

In some examples, in a case where the error floating range of the thickness H10 of the first organic light-sensitive material layer R10 is within a range of 5%×3 μm, that is, the thickness H10 of the first organic light-sensitive material layer R10 fluctuates within a range of +0.15 μm, it can be considered that the thickness H10 of the first organic light-sensitive material layer R10 satisfies the limitation condition of being equal to 3 μm; and in a case where the error floating range of the thickness H20 of the second organic light-sensitive material layer R20 is within a range of 5%×2 μm, that is, the thickness H20 of the second organic light-sensitive material layer R20 fluctuates within a range of +0.1 μm, it can be considered that the thickness H20 of the second organic light-sensitive material layer R20 satisfies the limitation condition of being equal to 2 μm.

For example, in a case where the thickness H10 of the first organic light-sensitive material layer R10 is a value such as 2.9 μm or 3.1 μm (e.g., the floating range is not more than 0.1 μm), it is also considered that the thickness H10 of the first organic light-sensitive material layer R10 satisfies the limitation condition of being equal to 3 μm; and in a case where the thickness H20 of the second organic light-sensitive material layer R20 is a value such as 1.9 μm or 2.1 μm (e.g., the floating range is not more than 0.1 μm), it is also considered that the thickness H20 of the second organic light-sensitive material layer R20 satisfies the limitation of being equal to 2 μm.

In some examples, the exposure amount to the first organic light-sensitive material layer is approximately 50 millijoules (MJ), and the exposure amount to the second organic light-sensitive material layer is approximately 60 millijoules (MJ).

On the basis of setting the exposure amount to the first organic light-sensitive material layer R10 to be less than the exposure amount to the second organic light-sensitive material layer R20, the exposure amount to the first organic light-sensitive material layer R10 is defined to be approximately 50 MJ, and the exposure amount to the second organic light-sensitive material layer R20 is defined to be approximately 60 MJ, so that the area of the second opening R21 formed in the second mask pattern R2 can be greater than the area of the first opening R11 formed in the first mask pattern R1, thereby improving the problem of the undercut structure in the connecting hole K.

In addition, since there is a certain uncontrollable error (such as a manufacturing process error, an equipment accuracy, and a measurement error), in a case where the error floating range of the exposure amount to the first organic light-sensitive material layer R10 is within a range of 20%×50 MJ, that is, the exposure amount to the first organic light-sensitive material layer R10 fluctuates within ±10 MJ, it can be considered that the exposure amount to the first organic light-sensitive material layer R10 satisfies a limitation condition of being equal to 50 MJ; and in a case where the error floating range of the exposure amount to the second organic light-sensitive material layer R20 is within a range of 20%×60 MJ, that is, the exposure amount to the second organic light-sensitive material layer R20 fluctuates within ±12 MJ, it can be considered that the exposure amount to the second organic light-sensitive material layer R20 satisfies a limitation condition of being equal to 60 MJ.

In some examples, in a case where the error floating range of the exposure amount to the first organic light-sensitive material layer R10 is within a range of 10%×50 MJ, that is, the exposure amount to the first organic light-sensitive material layer R10 fluctuates within ±5 MJ, it can be considered that the exposure amount to the first organic light-sensitive material layer R10 satisfies the limitation condition of being equal to 50 MJ; and in a case where the error floating range of the exposure amount to the second organic light-sensitive material layer R20 is within a range of 10%×60 MJ, that is, the exposure amount to the second organic light-sensitive material layer R20 fluctuates within ±6 MJ, it can be considered that the exposure amount to the second organic light-sensitive material layer R20 satisfies the limitation condition of being equal to 60 MJ.

In some examples, in a case where the error floating range of the exposure amount to the first organic light-sensitive material layer R10 is within a range of 5%×50 MJ, that is, the exposure amount to the first organic light-sensitive material layer R10 fluctuates within ±2.5 MJ, it can be considered that the exposure amount to the first organic light-sensitive material layer R10 satisfies the limitation condition of being equal to 50 MJ; and in a case where the error floating range of the exposure amount to the second organic light-sensitive material layer R20 is within a range of 5%×60 MJ, that is, the exposure amount to the second organic light-sensitive material layer R20 fluctuates within ±3 MJ, it can be considered that the exposure amount to the second organic light-sensitive material layer R20 satisfies the limitation condition of being equal to 60 MJ.

For example, in a case where the error floating range of the exposure amount to the first organic light-sensitive material layer R10 is a value such as 49 MJ or 51 MJ (e.g., the floating range is not more than 2 MJ), it can be considered that the exposure amount to the first organic light-sensitive material layer R10 satisfies the limitation condition of being equal to 50 MJ; and in a case where the error floating range of the exposure amount to the second organic light-sensitive material layer R20 is a value such as 59 MJ or 61 MJ (e.g., the floating range is not more than 2 MJ), it can be considered that the exposure amount to the second organic light-sensitive material layer R20 satisfies the limitation condition of being equal to 60 MJ.

Figure 29:
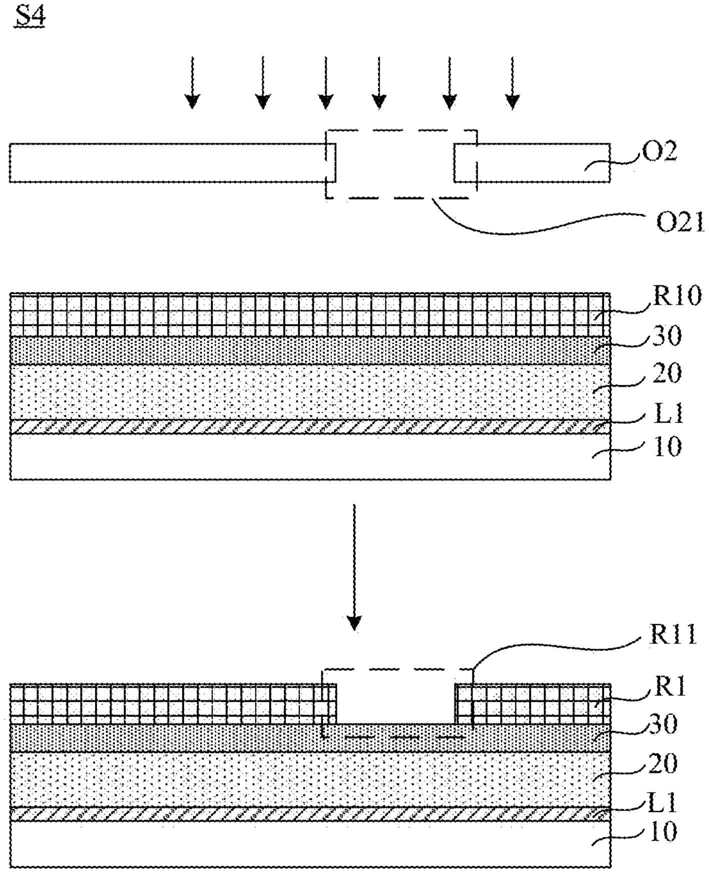
FIG. 29 is another structural diagram corresponding to step S4 in FIG. 22.
Figure 30:
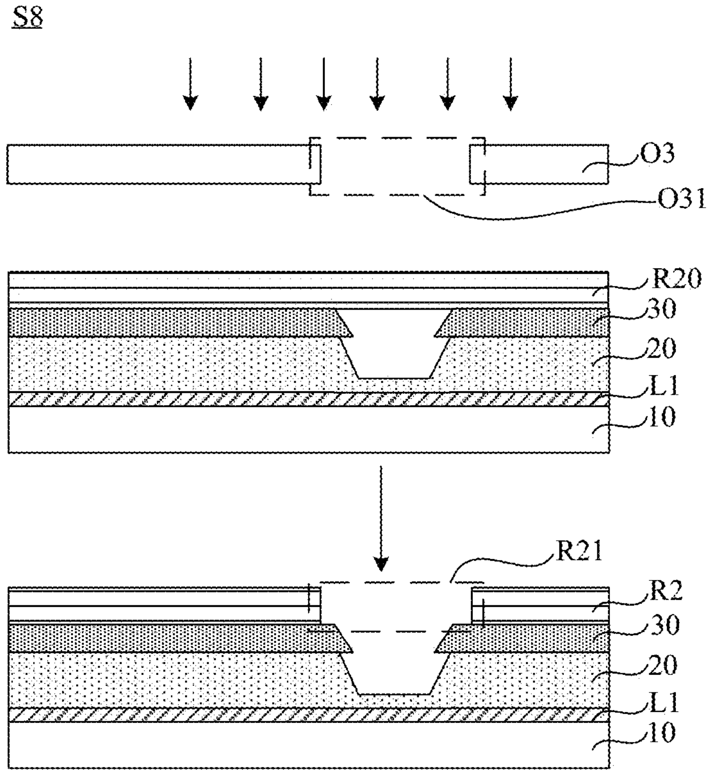
FIG. 30 another structural diagram corresponding to step S8 in FIG. 22.

FIG. 29 is another structural diagram corresponding to step S4 in FIG. 22. FIG. 30 another structural diagram corresponding to step S8 in FIG. 22. FIG. 29 and FIG. 30 only show the processes of step S4 and step S8 in FIG. 22, respectively, and FIG. 13 to FIG. 16 can be combined for the formation process of other film layers. In some embodiments, referring to FIG. 29, in step S4, forming the first mask pattern R1 includes: forming a first organic light-sensitive material layer R10 on the side of the first inorganic layer 30 away from the first base 10; and exposing and developing the first organic light-sensitive material layer R10 by using a second mask plate O2 to form the first mask pattern R1 with the first opening R11.

Referring to FIG. 30, in step S8, forming the second mask pattern R2 includes: forming a second organic light-sensitive material layer R20 on the side of the first inorganic layer 30 away from the first base 10; and exposing and developing the second organic light-sensitive material layer R20 by using a third mask plate O3 to form the second mask pattern R2 with the second opening R21. An area of a light-transmitting region O21 of the second mask plate O2 is less than an area of a light-transmitting region O31 of the third mask plate O3.

The first organic light-sensitive material layer R10 and the second organic light-sensitive material layer R20 are exposed and developed by using different masks, and the area of the light-transmitting region O21 of the second mask plate O2 is limited to be less than the area of the light-transmitting region O31 of the third mask plate O3, so that the area of the second opening R21 formed in the second mask pattern R2 can be greater than the area of the first opening R11 formed in the first mask pattern R1, thereby improving the problem of the undercut structure in the connecting hole K.

In a case where the first organic light-sensitive material layer R10 and the second organic light-sensitive material layer R20 are exposed and developed by using the different masks: a thickness of the first organic light-sensitive material layer R10 is equal to a thickness of the second organic light-sensitive material layer R20, and an exposure amount to the first organic light-sensitive material layer R10 is equal to an exposure amount to the second organic light-sensitive material layer R20; alternatively, the thickness of the first organic light-sensitive material layer R10 is greater than the thickness of the second organic light-sensitive material layer R20, and/or the exposure amount to the first organic light-sensitive material layer R10 is less than the exposure amount to the second organic light-sensitive material layer R20. The present disclosure is not limited thereto.

In some embodiments, referring to FIG. 24 again, in step S6, etching the first organic layer 20 by the second etching process by using the first opening R11 includes: etching the first organic layer 20 by using the first mask pattern R1 and the first inorganic layer 30 as masks.

In these embodiments, the first organic layer 20 is etched by the second gas, and when the second transition hole K21 is formed, the second gas hardly has an etching effect on the first inorganic layer 30, so that the first inorganic layer 30 can be used as the mask of the first organic layer 20, and the first organic layer 20 is etched by using the first mask pattern R1, so as to ensure that the first transition hole K11 and the second transition hole K22 form a nested structure, which is beneficial to forming the connecting hole K by the first via hole K1 and the second via hole K2.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A substrate, comprising:

a first base;

a first trace, located on a side of the first base;

a first organic layer, located on a side of the first trace away from the first base, wherein the first organic layer includes at least one first via hole, and a first via hole exposes a portion of the first trace;

a first inorganic layer, located on a side of the first organic layer away from the first base, wherein the first inorganic layer includes at least one second via hole; an orthographic projection, on the first base, of an edge of an opening of a second via hole at a side proximate to the first via hole is substantially coincident with an orthographic projection, on the first base, of an edge of an opening of the first via hole at a side proximate to the second via hole; the second via hole is communicated with the first via hole to form a connecting hole; a ratio of a depth of the connecting hole to a maximum radial dimension of the connecting hole is in a range of 1:1 to 1:2, inclusive; and a second trace, located on a side of the first inorganic layer away from the first base, wherein the second trace is connected to the first trace through the connecting hole.

2. The substrate according to claim 1, wherein the substrate comprises a plurality of connecting holes, wherein a minimum distance between two adjacent connecting holes is greater than or equal to 3 μm.

3. The substrate according to claim 1, wherein a slope angle of the first via hole is in a range of 70 degrees to 90 degrees, inclusive, and/or a slope angle of the second via hole is in a range of 70 degrees to 90 degrees, inclusive.

4. The substrate according to claim 1, wherein along a direction from the first organic layer toward the first base, opening areas of the connecting hole decrease.

5. The substrate according to claim 1, wherein the first organic layer serves as a second base; the substrate further comprises a plurality of conductive layers, wherein the plurality of conductive layers are arranged on the side of the first organic layer away from the first base in a stack; and the second trace is located in any one of the conductive layers.

6. The substrate according to claim 5, wherein the plurality of conductive layers include an active layer; the substrate further comprises:

a light-shielding pattern, arranged in a same layer as the first trace, wherein an orthographic projection of a channel portion of the active layer on the first base is located within an orthographic projection of the light-shielding pattern on the first base.

7. The substrate according to claim 5, wherein the plurality of conductive layers include a first gate metal layer and a second gate metal layer, wherein the second trace is located in the second gate metal layer; and the first inorganic layer includes at least one of: a first gate insulating layer, a second gate insulating layer or an interlayer dielectric layer, wherein the first gate insulating layer is located between the first organic layer and the first gate insulating layer;

the second gate insulating layer is located between the first gate metal layer and the second gate metal layer; and the interlayer dielectric layer is located on a side of the second gate metal layer away from the first base.

8. The substrate according to claim 1, wherein the substrate has: a display area, a first fan-out area and a bending area, wherein the first fan-out area is located between the display area and the bending area, wherein the second trace is located in the display area and extends to the first fan-out area;

the first trace is located in the bending area, and an end of the first trace extends to the first fan-out area; and at least one connecting hole is a first-type connecting hole, and the first-type connecting hole is located in the first fan-out area; and the end of the first trace located in the first fan-out area is electrically connected to a portion of the second trace located in the first fan-out area through the first-type connecting hole.

9. The substrate according to claim 1, wherein the substrate has: a display area and a bending area, wherein the second trace is located in the display area;

the first trace is located in the bending area, and an end of the first trace extends to the display area; and at least one connecting hole is a second-type connecting hole, and the second-type connecting hole is located in the display area; and the end of the first trace located in the display area is electrically connected to the second trace through the second-type connecting hole.

10. The substrate according to claim 9, wherein the display area includes a first display region, a second display region, and a third display region, wherein the second display region is located between the first display region and the third display region, and the third display region is closer to the bending area than the second display region; and the second-type connecting hole is located in any one of the first display region, the second display region and the third display region.

11. The substrate according to claim 1, wherein the substrate has: a display area, a bending area and a second fan-out area, wherein the bending area is located between the display area and the second fan-out area; and the substrate further comprises a third trace, wherein the third trace is located in the second fan-out area, wherein the first trace is located in the bending area, and an end of the first trace extends to the second fan-out area; and at least one connecting hole is a third-type connecting hole, and the third-type connecting hole is located in the second fan-out area; the end of the first trace located in the second fan-out area is electrically connected to the third trace through the third-type connecting hole.

12. A display panel, comprising the substrate according to claim 1.

13. A manufacturing method of a substrate, the manufacturing method comprising:

forming a first trace on a first base;

forming a first organic layer on a side of the first trace away from the first base;

forming a first inorganic layer on a side of the first organic layer away from the first base;

forming a first mask pattern on a side of the first inorganic layer away from the first base, wherein the first mask pattern includes a first opening;

etching the first inorganic layer by a first etching process by using the first opening to form a first transition hole in the first inorganic layer, wherein the first transition hole exposes a portion of the first organic layer; and a rate at which the first etching process etches the first inorganic layer is greater than a rate at which the first etching process etches the first organic layer;

etching the first organic layer by a second etching process by using the first opening to form a second transition hole in the exposed portion of the first organic layer, wherein a depth of the second transition hole is less than or equal to a thickness of the first organic layer; and a rate at which the second etching process etches the first organic layer is greater than a rate at which the second etching process etches the first inorganic layer;

removing the first mask pattern;

forming a second mask pattern on a side of the first inorganic layer away from the first base, wherein the second mask pattern includes a second opening opposite to the first opening; and an area of the second opening is greater than an area of the first opening;

etching the first inorganic layer and the first organic layer by the first etching process by using the second opening, so that the first transition hole is expanded outwardly to form a second via hole, and the second transition hole is expanded outwardly to form a first via hole, wherein an orthographic projection, on the first base, of an edge of an opening of the second via hole at a side proximate to the first via hole is substantially coincident with an orthographic projection, on the first base, of an edge of an opening of the first via hole at a side proximate to the second via hole; and the first via hole and the second via hole form a connecting hole, and the connecting hole exposes a portion of the first trace;

removing the second mask pattern; and forming a second trace on a side of the first inorganic layer away from the first base, wherein the second trace is connected to the first trace through the connecting hole.

14. The manufacturing method according to claim 13, wherein a result of H1 minus H2 is less than or equal to H3 (H1−H2≤H3), wherein H1 is the thickness of the first organic layer, H2 is the depth of the second transition hole, and H3 is a thickness of the first inorganic layer; and/or a distance between an edge of an orthographic projection of the first opening on the first base and an orthographic projection of an edge of the second opening on the first base is in a range of 0.5 μm to 1 μm, inclusive.

15. The manufacturing method according to claim 13, wherein forming the first mask pattern includes:

forming a first organic light-sensitive material layer on the side of the first inorganic layer away from the first base; and exposing and developing the first organic light-sensitive material layer by using a first mask plate to form the first mask pattern with the first opening; and forming the second mask pattern includes:

forming a second organic light-sensitive material layer on the side of the first inorganic layer away from the first base; and exposing and developing the second organic light-sensitive material layer by using the first mask plate to form the second mask pattern with the second opening;

wherein a thickness of the first organic light-sensitive material layer is greater than a thickness of the second organic light-sensitive material layer, and/or an exposure amount to the first organic light-sensitive material layer is less than an exposure amount to the second organic light-sensitive material layer.

16. The manufacturing method according to claim 15, wherein the thickness of the first organic light-sensitive material layer is approximately 3 μm, and the thickness of the second organic light-sensitive material layer is approximately 2 μm; and/or the exposure amount to the first organic light-sensitive material layer is 50 millijoules (MJ), and the exposure amount to the second organic light-sensitive material layer is 60 millijoules (MJ).

17. The manufacturing method according to claim 13, wherein forming the first mask pattern includes:

forming a first organic light-sensitive material layer on the side of the first inorganic layer away from the first base; and exposing and developing the first organic light-sensitive material layer by using a second mask plate to form the first mask pattern with the first opening; and forming the second mask pattern includes:

forming a second organic light-sensitive material layer on the side of the first inorganic layer away from the first base; and exposing and developing the second organic light-sensitive material layer by using a third mask plate to form the second mask pattern with the second opening;

wherein an area of a light-transmitting region of the second mask plate is less than an area of a light-transmitting region of the third mask plate.

18. The manufacturing method according to claim 13, wherein etching the first organic layer by the second etching process by using the first opening includes:

etching the first organic layer by taking the first mask pattern and the first inorganic layer as masks.

19. The manufacturing method according to claim 13, wherein etching the first inorganic layer by the first etching process by using the first opening includes: introducing a first gas into the first opening to etch the first inorganic layer;

etching the first inorganic layer and the first organic layer by the first etching process by using the second opening includes: introducing the first gas into the second opening to etch the first inorganic layer and the first organic layer, wherein an etching rate of the first gas on the first inorganic layer is greater than an etching rate of the first gas on the first organic layer; and etching the first organic layer by the second etching process by using the first opening includes: introducing a second gas into the first opening to etch the first organic layer, wherein an etching rate of the second gas on the first organic layer is greater than an etching rate of the second gas on the first inorganic layer.

20. The manufacturing method according to claim 19, wherein the first gas includes carbon tetrafluoride and sulfur hexafluoride, and the second gas includes carbon tetrafluoride and oxygen.

* * * * *